(12) United States Patent
Ootsuka

(10) Patent No.: US 8,853,758 B2
(45) Date of Patent: Oct. 7, 2014

(54) SOLID-STATE IMAGING DEVICE, METHOD OF MANUFACTURING SOLID-STATE IMAGING DEVICE, AND ELECTRONIC APPARATUS

(75) Inventor: Yoichi Ootsuka, Kumamoto (JP)

(73) Assignee: Sony Corporation (JP)

( * ) Notice: Subject to any disclaimer, the term of this patent is extended or adjusted under 35 U.S.C. 154(b) by 148 days.

(21) Appl. No.: 13/412,748

(22) Filed: Mar. 6, 2012

(65) Prior Publication Data

US 2012/0235266 A1 Sep. 20, 2012

(30) Foreign Application Priority Data

Mar. 14, 2011 (JP) ................................. 2011-055630

(51) Int. Cl.
*H01L 31/062* (2012.01)
*H01L 27/146* (2006.01)

(52) U.S. Cl.
CPC .... *H01L 27/14627* (2013.01); *H01L 27/14623* (2013.01); *H01L 27/1464* (2013.01); *H01L 27/14685* (2013.01)
USPC ................... 257/294; 257/435; 257/E31.121; 257/E29.282; 257/E31.122; 250/208.1

(58) Field of Classification Search
CPC ................... H01L 27/14623; H01L 27/14818; H01L 27/14621; H01L 31/02162; H01L 29/78633; H01L 21/02162; H01L 21/02164
USPC ........... 257/294, E31.121, E31.122, E29.282, 257/291, 435, 432, E31.127
See application file for complete search history.

(56) References Cited

U.S. PATENT DOCUMENTS

| | | | |
|---|---|---|---|
| 2007/0210395 A1* | 9/2007 | Maruyama et al. | 257/431 |
| 2009/0014823 A1* | 1/2009 | Kokusenya | 257/432 |
| 2010/0245637 A1* | 9/2010 | Itonaga | 348/273 |
| 2011/0074991 A1* | 3/2011 | Sakoh | 348/279 |
| 2012/0075509 A1* | 3/2012 | Ito et al. | 348/265 |
| 2012/0320242 A1* | 12/2012 | Ogita et al. | 348/276 |
| 2013/0256821 A1* | 10/2013 | Ohba et al. | 257/432 |

FOREIGN PATENT DOCUMENTS

| | | |
|---|---|---|
| JP | 3050583 | 3/2000 |
| JP | 2002-314058 | 10/2002 |
| JP | 2006-019653 | 1/2006 |

* cited by examiner

*Primary Examiner* — Chuong A Luu
*Assistant Examiner* — Moazzam Hossain
(74) *Attorney, Agent, or Firm* — Sheridan Ross P.C.

(57) ABSTRACT

There is provided a solid-state imaging device including plural pixel regions, each including a pixel having a photoelectric conversion unit, a color filter, and a microlens that condenses the incident light to the photoelectric conversion unit; a first light shielding portion that has a first end face at the side of the microlens, and a second end face opposite to the first end face, and that is formed at each side portion of each pixel region of the plurality of the pixel regions; and a second light shielding portion that has a first end face at the side of the microlens, and a second end face opposite to the first end face, and that is formed at each corner portion of the pixel region, in which a distance from a surface of the pixel to the first end face is short compared to the first light shielding portion.

20 Claims, 27 Drawing Sheets

FIG. 7A (a) (b)
FIG. 7B (a) (b)
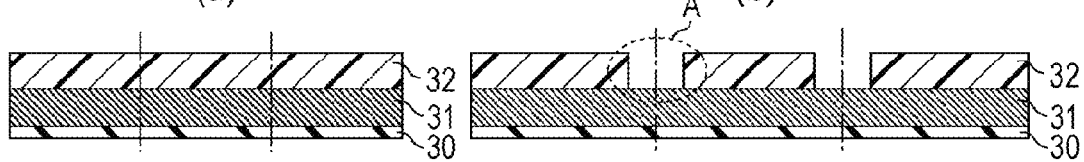
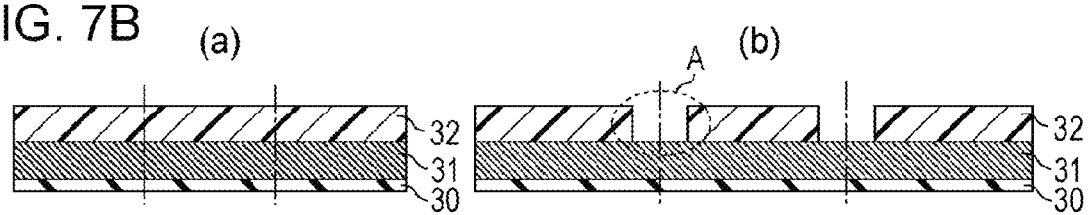
FIG. 7C (a) (b)
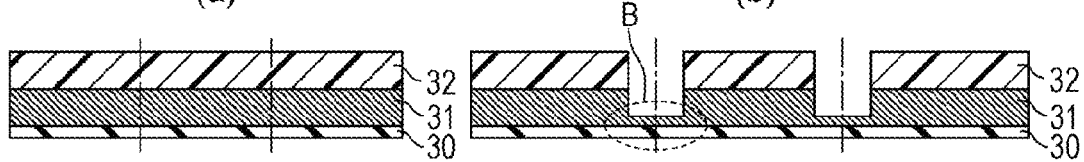
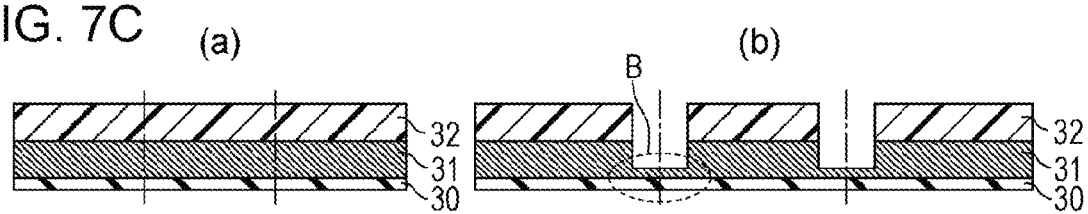
FIG. 7D (a) (b)
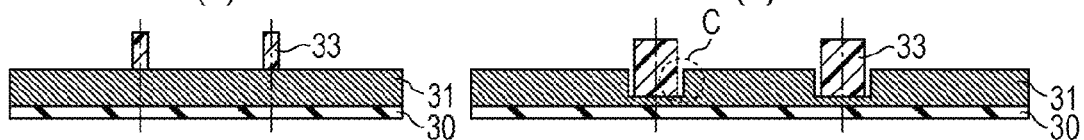
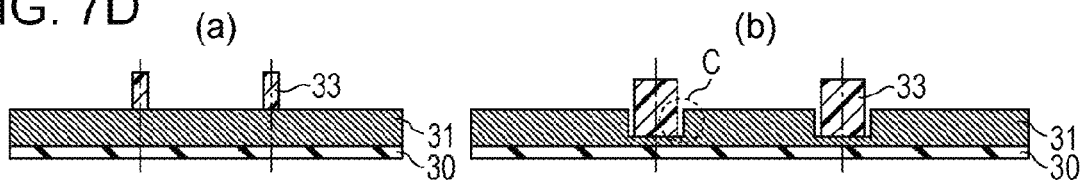
FIG. 7E (a) (b)
FIG. 7F (a) (b)
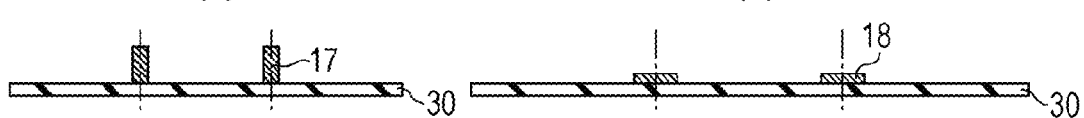
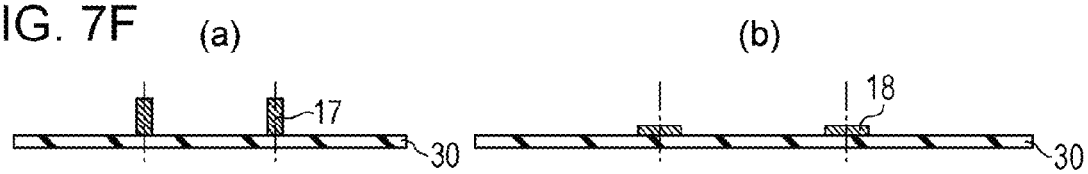

FIG. 8A (a) (b)
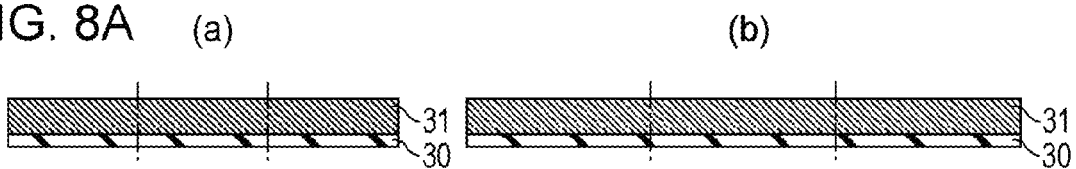
FIG. 8B (a) (b)
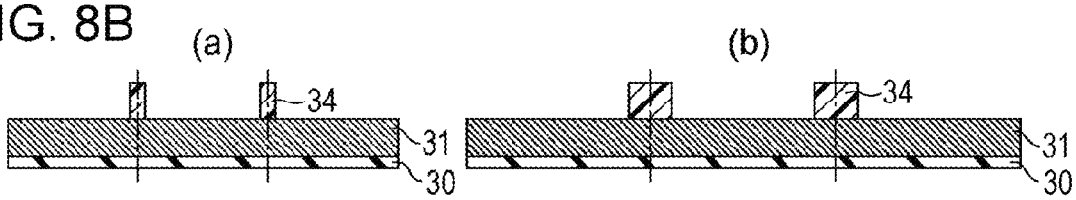
FIG. 8C (a) (b)
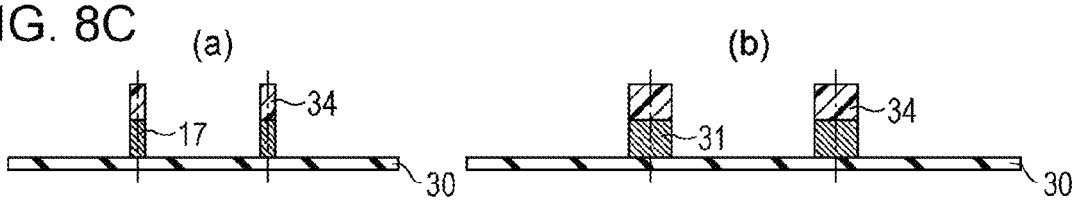
FIG. 8D (a) (b)
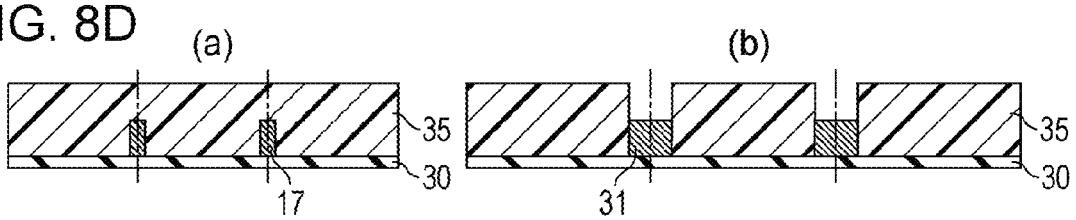
FIG. 8E (a) (b)
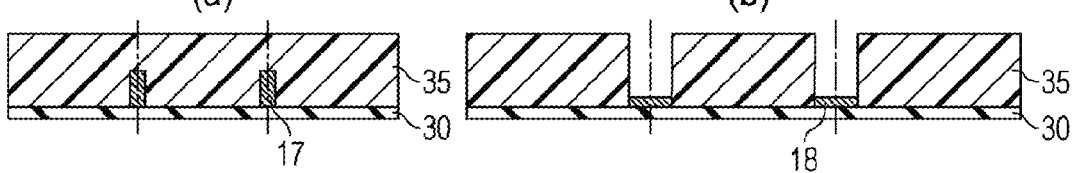
FIG. 8F (a) (b)
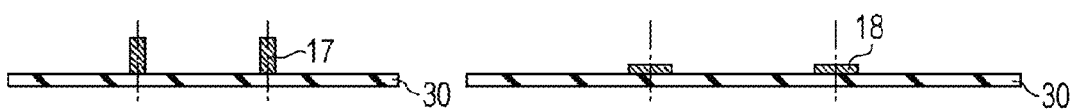

FIG. 11A (a) (b)
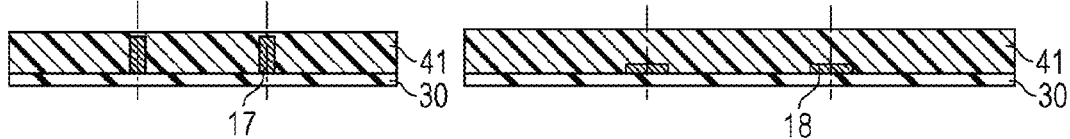
FIG. 11B (a) (b)
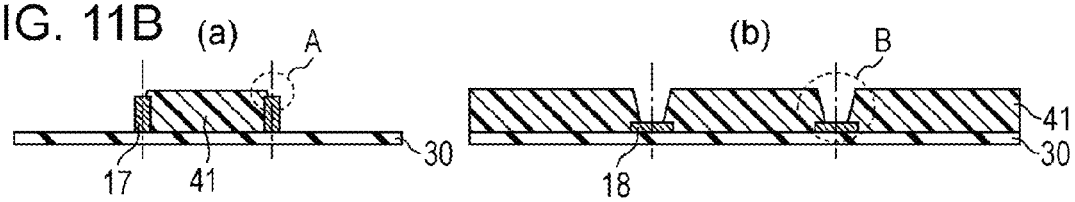
FIG. 11C (a) (b)
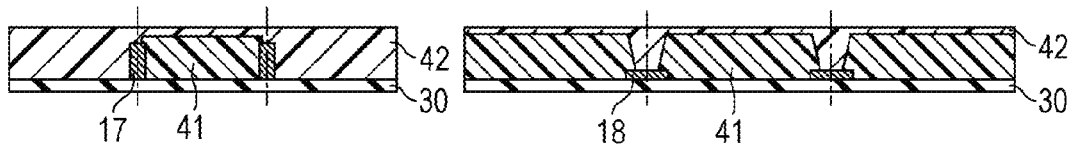
FIG. 11D (a) (b)
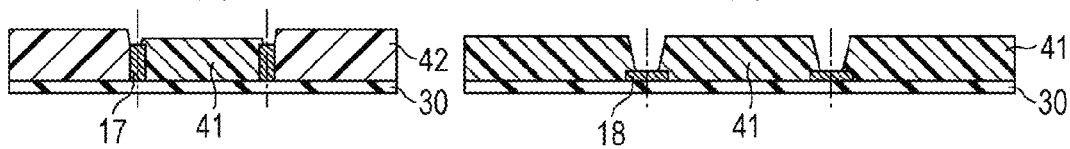
FIG. 11E (a) (b)
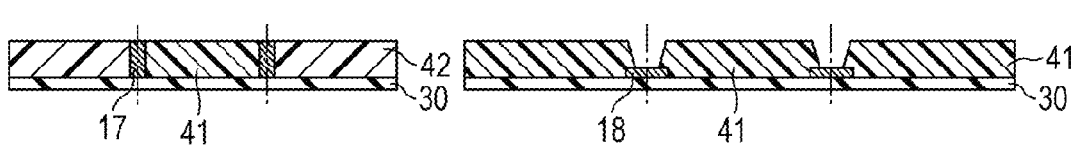

FIG. 13A (a) (b)
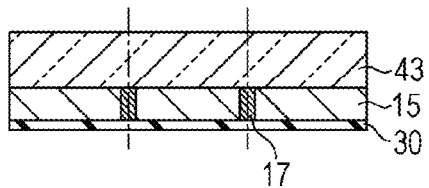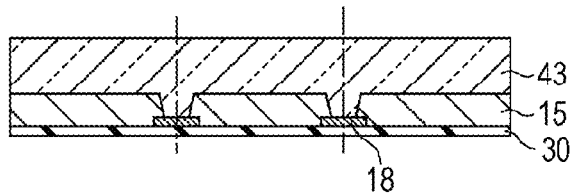
FIG. 13B (a) (b)
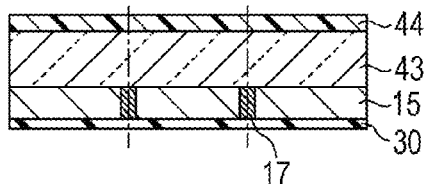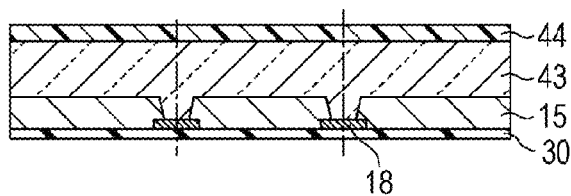
FIG. 13C (a) (b)
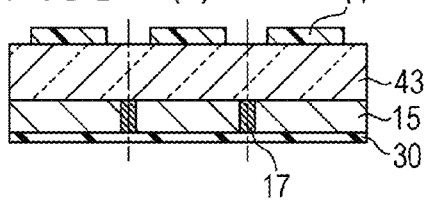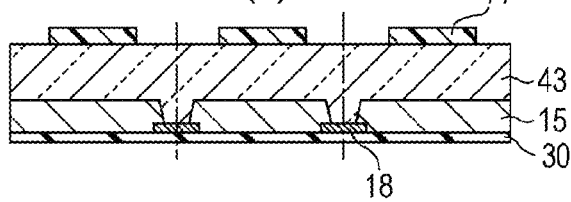
FIG. 13D (a) (b)
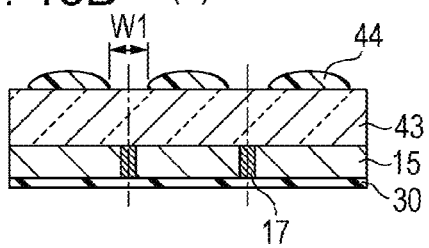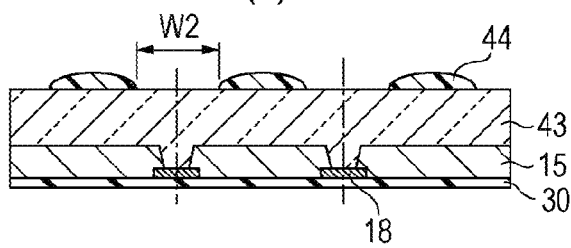
FIG. 13E (a) (b)
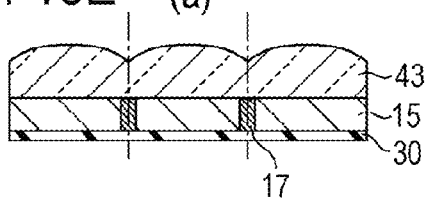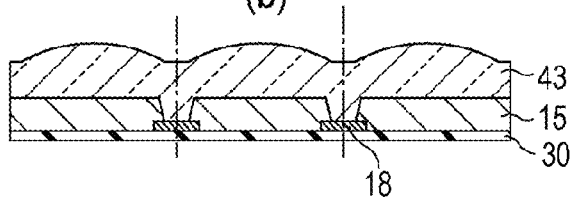
FIG. 13F (a) (b)
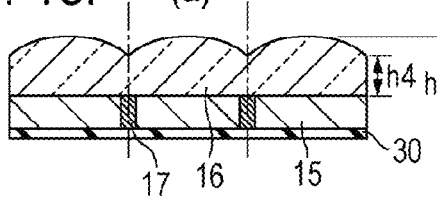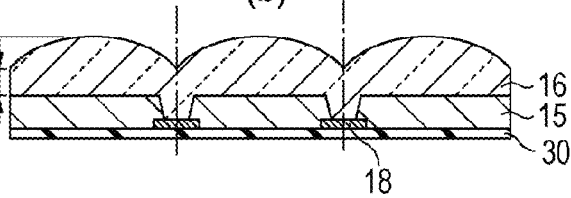

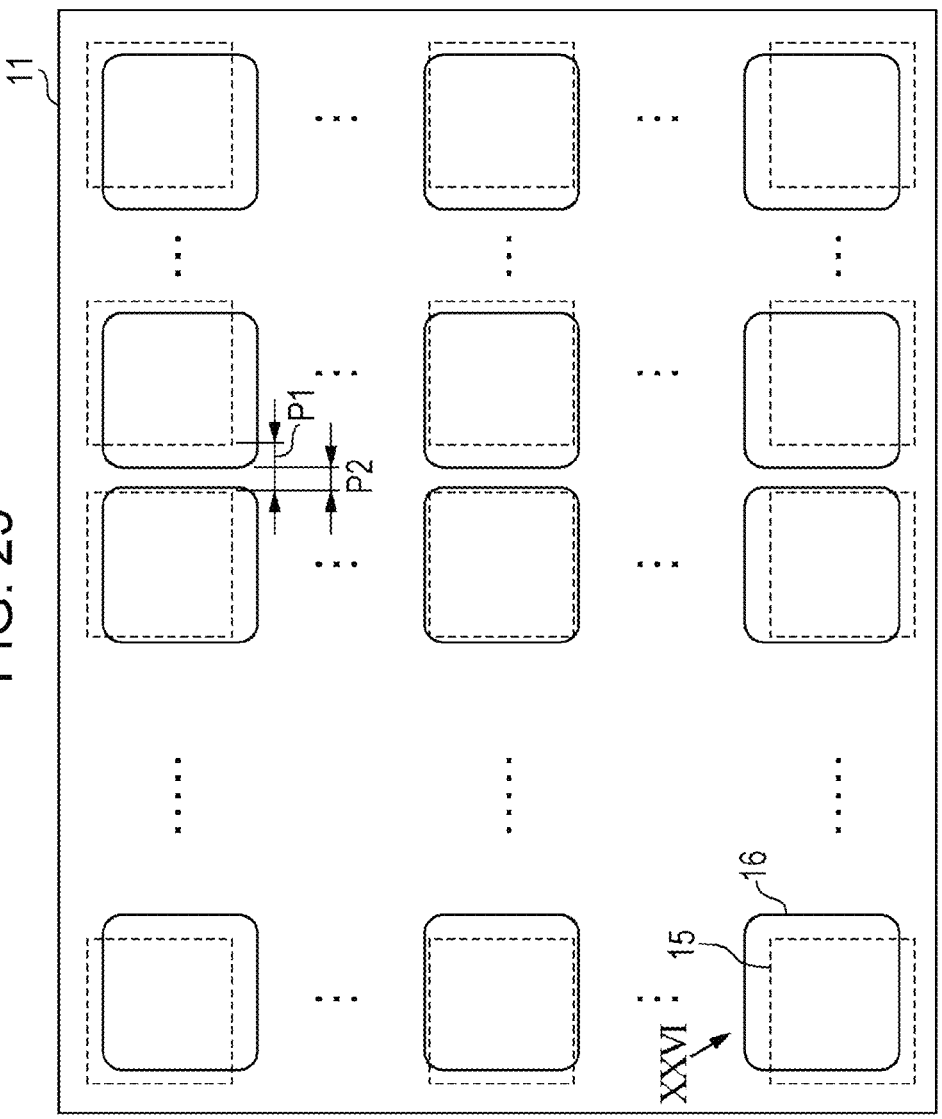

SOLID-STATE IMAGING DEVICE, METHOD OF MANUFACTURING SOLID-STATE IMAGING DEVICE, AND ELECTRONIC APPARATUS

BACKGROUND

The present disclosure relates to a solid-state imaging device, a method of manufacturing a solid-state imaging device, and an electronic apparatus.

As solid-state imaging devices that are used in digital cameras or video cameras, CCD-type solid-state imaging devices or CMOS-type solid-state imaging devices are disclosed in the related art. Such solid-state imaging devices are largely classified into two kinds depending on a direction of light incident to a light sensing portion.

One kind of the solid-state imaging devices is a solid-state imaging device that senses light incident from a front surface side of a semiconductor substrate in which an interconnection layer is formed (for example, refer to Japanese Unexamined Patent Application Publication No. 2002-314058). The other kind of the solid-state imaging devices is a so-called rear surface irradiation type solid-state imaging device that senses light incident from a rear surface side of a semiconductor substrate in which the interconnection layer is not formed (for example, refer to Japanese Unexamined Patent Application Publication Nos. 2009-176949 and 2006-019653 and Japanese Patent No. 3050583).

In such solid-state imaging devices, a light shielding film is provided to shield between pixels. For example, in the solid-state imaging device disclosed in Japanese Unexamined Patent Application Publication No. 2009-176949, a light shielding film is provided in the same plane as a color filter so as to reduce a color mixture to adjacent pixels.

When the light shielding film is provided to the solid-state imaging device, the color mixture to adjacent pixels may be reduced, but there is a problem in that a part of obliquely incident light is interrupted by the light shielding film and thereby a light sensitivity with respect to the obliquely incident light decreases.

Japanese Unexamined Patent Application Publication No. 2002-314058 discloses a method in which the obliquely incident light is condensed by microlenses provided in a multi-layer fashion to reliably condense the light to the light sensing portion.

SUMMARY

However, in the method disclosed in Japanese Unexamined Patent Application Publication No. 2002-314058, in addition to the microlenses, it is necessary to provide in-layer micro concave lens, such that there is a problem in that it is difficult to make a thickness from the microlens to the light sensing portion small.

It is desirable to provide a solid-state imaging device capable of suppressing a deterioration of a light sensitivity, and a manufacturing method thereof.

In addition, it is desirable to provide an electronic apparatus provided with the solid-state imaging device.

According to an embodiment of the present disclosure, there is disclosed a solid-state imaging device including a plurality of pixel regions, each including a pixel having a photoelectric conversion unit that converts incident light to an electric signal, a color filter that is formed in correspondence with the pixel, and a microlens that condenses the incident light to the photoelectric conversion unit through the color filter; a first light shielding portion that has a first end face at the side of the microlens, and a second end face opposite to the first end face, and that is formed at each side portion of each pixel region of the plurality of the pixel regions; and a second light shielding portion that has a first end face at the side of the microlens, and a second end face opposite to the first end face, and that is formed at each corner portion of the pixel region, in which a distance from a surface of the pixel to the first end face is short compared to the first light shielding portion.

According to the solid-state imaging device according to this embodiment of the present disclosure, the distance from a surface of the pixel to the microlens side end face of the second light shielding portion formed at each corner portion of the pixel region is short compared to the first light shielding portion. Therefore, the incident light from the corner portion of the microlens is incident to the photoelectric conversion unit without being interrupted by the second light shielding portion. As a result thereof, the light incident to the photoelectric conversion unit increases.

In addition, according to another embodiment of the present disclosure, there is provided a method of manufacturing a solid-state imaging device. The method includes forming pixels having a photoelectric conversion unit that converts incident light to an electric signal; forming a color filter formed in correspondence with each of the pixels; forming a microlens that condenses the incident light to the photoelectric conversion unit through the color filter; and forming a first light shielding portion that is formed at each side portion of pixel regions including the pixel, the color filter, and the microlens, and that have a first end face at the side of the microlens, and a second end face opposite to the first end face, and second light shielding portion that has a first end face at the side of the microlens and a second end face opposite to the first end face, and that is formed at each corner portion of the pixel region, in which a distance from a surface of the pixel to the first end face is short compared to the first light shielding portion.

According to still another embodiment of the present disclosure, there is provided an electronic apparatus including the above-described solid-state imaging device, an optical lens, and a signal processing circuit.

According to the embodiments of the present disclosure, it is possible to suppress the deterioration of a light sensitivity.

BRIEF DESCRIPTION OF THE DRAWINGS

FIGS. 7A to 7F are manufacturing process diagrams of the light shielding film according to the first embodiment of the present disclosure;

FIGS. 8A to 8F are manufacturing process diagrams of the light shielding film according to the first embodiment of the present disclosure;

FIGS. 11A to 11E are manufacturing process diagrams of a color filter according to the first embodiment of the present disclosure;

FIGS. 13A to 13F are manufacturing process diagrams of the microlens according to the first embodiment of the present disclosure;

FIG. 25 is a plan view of a solid-state imaging device according to a fourth embodiment of the present disclosure;

DETAILED DESCRIPTION OF EMBODIMENTS

First Embodiment

Figure 1:
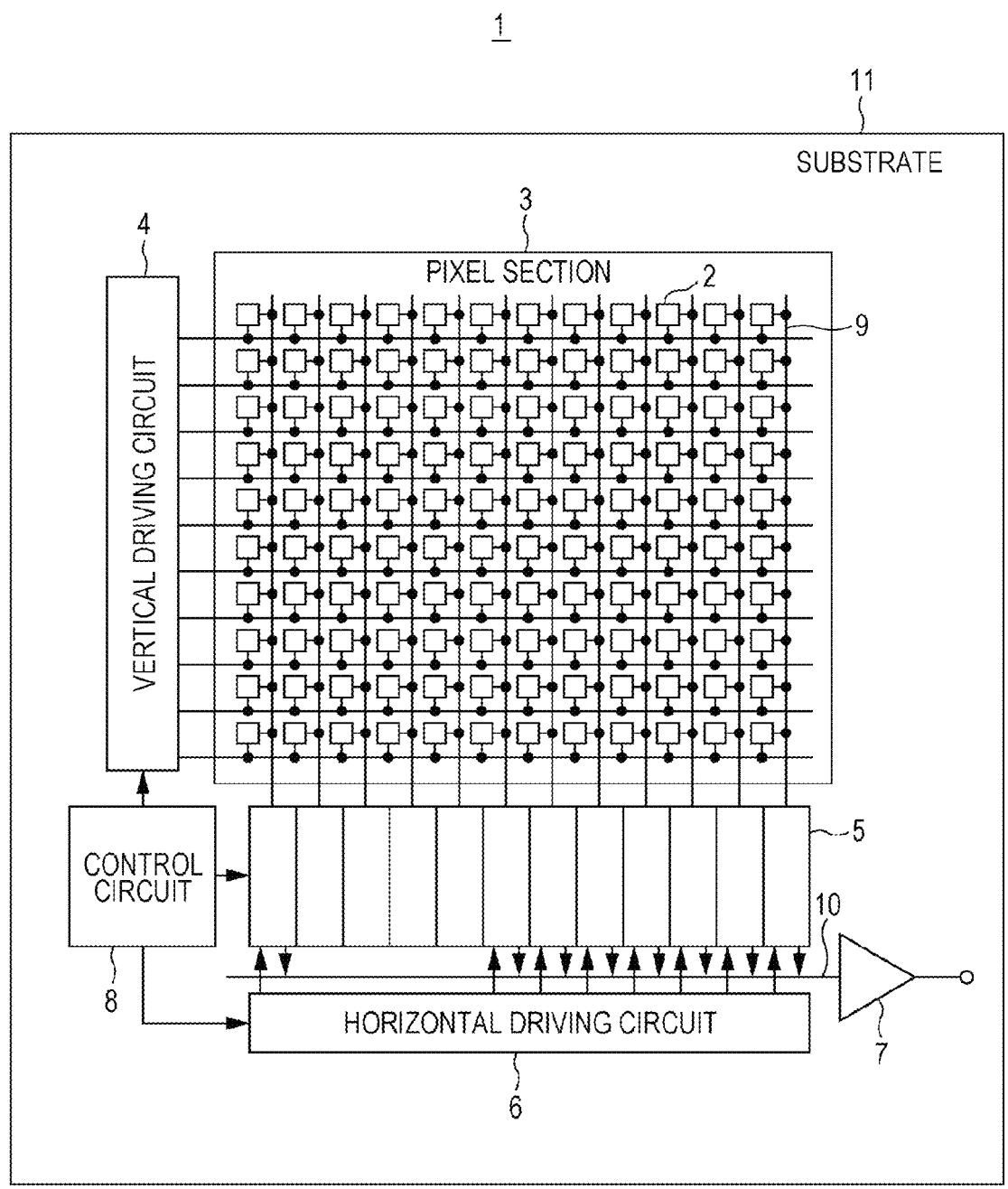
FIG. 1 is a diagram illustrating a solid-state imaging device according to a first embodiment of the present disclosure.

FIG. 1 is a schematic configuration diagram illustrating an example of a solid-state imaging device according to a first embodiment of the present disclosure. The solid-state imaging device 1 shown in FIG. 1 includes a substrate 11 formed of silicon, a pixel portion 3 having a plurality of pixels 2 arranged on the substrate 11, a vertical driving circuit 4, column signal processing circuits 5, a horizontal driving circuit 6, an output circuit 7, and a control circuit 8.

The pixel portion 3 includes a plurality of pixels 2 that is regularly arranged in a two-dimensional array shape. The pixel portion 3 includes an effective pixel region that actually receives incident light, amplifies a signal charge generated by a photoelectric conversion, and reads out the resultant amplified signal charge to the signal processing circuit 5, a black reference pixel region (not shown) to output an optical black that becomes a reference of a black revel. The black reference pixel region is commonly formed at an outer peripheral portion of the effective pixel region.

Each of the pixels 2 includes a photoelectric conversion element (not shown) that is, for example, a photodiode, and a plurality of pixel transistors (not shown). The pixels 2 are regularly disposed on the substrate 11 in a two-dimensional array shape. The plurality of pixel transistors may include four MOS transistors of a transmission transistor, a reset transistor, a selection transistor, and an amplification transistor, or may include three transistors except for the selection transistor.

The control circuit 8 generates a clock signal or a control signal that serves as a reference of an operation of the vertical driving circuit 4, the column signal processing circuits 5, and the horizontal driving circuit 6 on the basis of a vertical synchronization signal, a horizontal synchronization signal, and a master clock. The control circuit 8 controls the vertical driving circuit 4, the column signal processing circuits 5, and the horizontal driving circuit 6 using the clock signal or the control signal.

The vertical driving circuit 4 is configured by, for example, a shift transistor, and selectively scans the pixel 2 by a row unit sequentially in a vertical direction. The vertical driving circuit 4 supplies a pixel signal that is based on the signal charge generated in response to the amount of light received in the photoelectric conversion element of the pixel 2 to the column signal processing circuits 5 through a vertical signal line 9.

Each of the column signal processing circuits 5 is disposed, for example, for each column of the pixels 2, and performs a signal processing such as nose removal or signal amplification by a signal supplied from the black reference pixel region with respect to a signal output from the pixels 2 of one row for each pixel column. A horizontal selection switch (not shown) is provided to an output terminal of the column signal processing circuit 5 at a position between the output terminal and a horizontal signal line 10.

The horizontal driving circuit 6 is configured by, for example, a shift register. The horizontal driving circuit 6 sequentially outputs a horizontal scanning pulse, sequentially selects each of the column signal processing circuits 5, and outputs a pixel signal supplied from each of the column signal processing circuits 5 to the horizontal signal line 10.

The output circuit 7 performs a signal processing with respect to the pixel signal that is sequentially supplied from each of the column signal processing circuits 5 through the horizontal signal line 10 and outputs the processed signal to an external device (not shown).

Figure 2A:
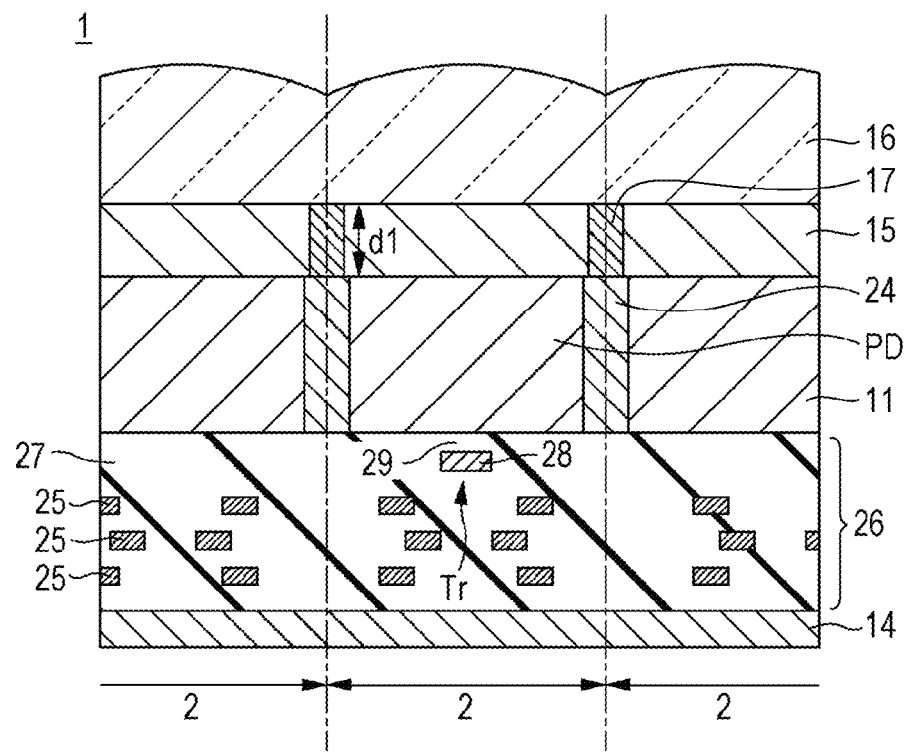
FIGS. 2A and 2B are cross-sectional views of the solid-state imaging device according to the first embodiment of the present disclosure.
Figure 2B:
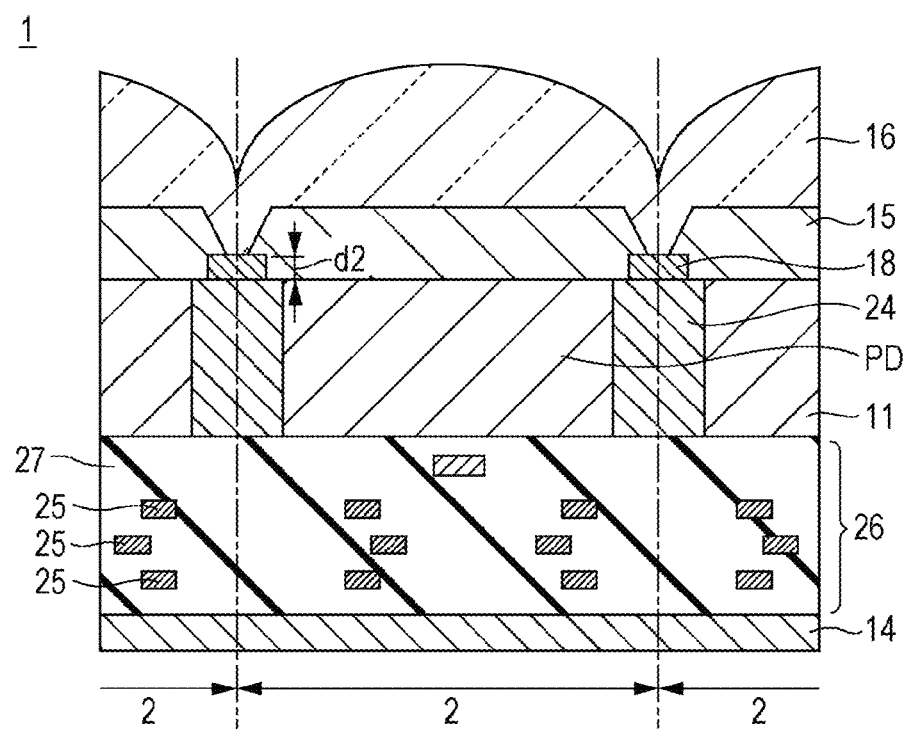

Next, details of the solid-state imaging device 1 will be described with reference FIGS. 2A and 2B. FIG. 2A shows a cross-sectional view of the solid-state imaging device 1 in a side direction of the pixel portion 3. FIG. 2B shows a cross-sectional view of the solid-state imaging device 1 in a diagonal direction of the pixel portion 3.

As shown in FIGS. 2A and 2B, the solid-state imaging device 1 according to this embodiment includes a substrate 11, an interconnection layer 26 and a supporting substrate 14 that are formed at a front surface side of the substrate 11, and a color filter 15 and a microlens 16 that are formed at a rear surface side of the substrate 11.

The substrate 11 is a semiconductor substrate that has a thickness of, for example, substantially 3 to 5 μm, and is formed of silicon. A plurality of pixels 2, each including a photoelectric conversion element PD and a plurality of pixel transistor Tr that makes up a pixel circuit unit, is formed in the substrate 11 in a two-dimensional matrix state. In addition, although not shown in FIGS. 2A and 2B, a peripheral circuit unit is configured at a peripheral region of the pixels 2 formed in the substrate 11.

The photoelectric conversion element PD is, for example, a photodiode, and generates a signal charge corresponding to the amount of light received of the incident light and stores the signal charge therein.

The pixel transistor Tr includes source and drain regions (not shown) that are formed at the front surface side of the substrate 11, and a gate electrode 28 that is formed above the front surface of the substrate 11 through a gate insulation film 29.

In addition, an isolation region 24 configured by a highly concentrate impurity region ranging from front surface to rear surface of the substrate 11 is formed between pixels 2 adjacent to each other. Respective pixels 2 are electrically isolated by the isolation region 24.

The interconnection layer 26 is formed at the front surface side of the substrate 11, and includes interconnections 25 that are laminated in a plurality of layers (three layers in FIGS. 2A and 2B) with an interlayer insulation film 27 interposed therebetween. The pixel transistor Tr making up each of the pixels 2 operates through the interconnections 25 formed in the interconnection layer 26.

The supporting substrate 14 is formed at a face of the interconnection layer 26, which is opposite to a face that comes into contact with the substrate 11. The supporting substrate 14 is configured to secure strength of the substrate 11 during a manufacturing process, and is configured by, for example, a silicon substrate.

The color filter 15 is formed at the rear surface side of the substrate 11, and includes, for example, first color filter component, second color filter component, and third color filter component for each pixel. In the following description, the first color filter component, the second color filter component, and the third color filter components are called a green filter component, a red filter component, and a blue filter component, respectively, but it is not limited thereto and may be configured by an arbitrary color filter components. In addition, in addition to the color filter components, it may use, for example, a transparent resin that transmits visible light, or a filter component that attenuates the visible light, such as an ND filter that is formed by adding a carbon black pigment in the transparent resin.

In the color filter 15, light with a desired wavelength is transmitted therethrough and the transmitted light is incident to the photoelectric conversion element PD in the substrate 11.

A first light shielding portion 17 and a second light shielding portion 18 are provided between respective color filter components of the color filter 15. In the following description, the first light shielding portion 17 and the second light shielding portion 18 are collectively referred to as a light shielding film. A distance from the pixel 2 to a face (a first end face), which is closest to the microlens 16, of the first light shielding portion 17 is longer compared to the second light shielding portion 18. That is, when the distances from the pixels 2 to the faces, which are closest to the microlens 16, of the first light shielding portion 17 and the second light shielding portion 18 are set to d1 and d2 (d1, d2>0), respectively, d1>d2 is satisfied. The light shielding film is provided to reduce a color mixture of the incident light to adjacent photoelectric conversion elements PD. Details of the color filter 15 and the light shielding film will be described later.

The microlens 16 is formed on a face of the color filter 15, which is opposite to a face thereof that comes into contact with the substrate 11. The microlens 16 condenses the incident light to the photoelectric conversion element PD through one of the respective color filter components of the color filter 15.

In addition, here, although not shown in the drawings, an insulation film may be provided between the substrate 11 and the light shielding film, or a barrier metal may be provided between the light shielding film and the substrate or the insulation film.

In this embodiment, a portion, which is surrounded by one-dotted lines in FIGS. 2A and 2B, and that includes the pixel 2, a color filter component of the color filter 15, and the microlens 16, is referred to as a pixel region. The broken lines in FIGS. 2A and 2B, which are boundaries of respective pixel regions, are referred to as pixel boundaries. A plane of the pixel region of the solid-state imaging device 1 according to this embodiment has a quadrilateral shape, and a line segment passing through the centers of opposite sides of the quadrilateral shape is referred to as a side direction of the pixel region, and a line segment connecting opposite corners of the quadrilateral shape is referred to as a diagonal direction.

Details of the microlens 16 according to this embodiment will be described with reference to FIG. 3A to 3D.

There are two kinds of methods that are generally used to form the microlens 16. One is a method in which a microlens material of a photosensitive resin material is applied onto the color filter 15 through a cover film, and a heat treatment is performed at a temperature equal to or higher than a thermal softening point of the photosensitive resin after prebaking, exposing, developing, and bleaching exposure are sequentially performed. The microlens 16 having a convex shape is formed on the color filter 15 by this method. When performing a heat treatment, a condition is set in order for photosensitive resin patterns formed at pixels adjacent to each other not to be fused to each other. This is because when resins flowing by the heat treatment come into contact with each other, the patterns flow down due to a surface tension, and thereby a shape of lens collapses.

As the other method, there is a method in which a microlens material is formed on the color filter 15, a lens-shaped mask layer having a concave shape is formed on this microlens material, and the mask layer is etching-transferred to an underlying microlens material.

In this method, after the microlens material is formed on the color filter 15, the photosensitive resin is applied on the microlens material, and a heat treatment is performed at a temperature equal to or higher than a thermal softening point of the photosensitive resin after prebaking, exposing, developing, and bleaching exposure are sequentially performed to form a lens-shaped mask layer having a convex shape. Next, the mask layer is etching-transferred to an underlying microlens material so as to form the microlens 16. According to this method, when etching conditions are appropriately adjusted, it is possible to enlarge dimensions of the microlens 16 than that of the mask layer in a plan view, and therefore an effective area of the microlens 16 is enlarged and a lens having a relatively higher condensing property may be formed.

Figure 3A:
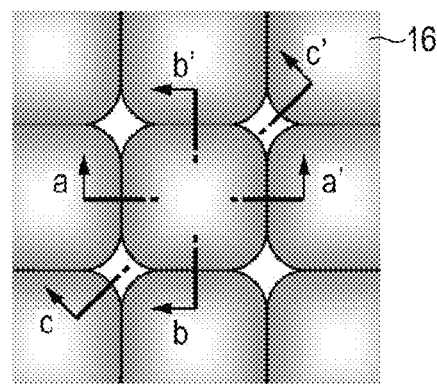
FIGS. 3A to 3D are diagrams illustrating a microlens according to the first embodiment of the present disclosure.

FIG. 3A shows plan views of the microlens 16 to which the etching process is performed until each side of adjacent microlenses 16 comes into contact with each other. FIG. 3C shows cross-sectional views taken along a line a-a', a line b-b', and a line c-c' of the microlens 16 shown in FIG. 3A. The line a-a' and line b-b' correspond to the side direction in the pixel region, and the line c-c' corresponds to the diagonal direction in the pixel region.

As shown in FIG. 3C, in a case where the etching process is performed until the sides of the adjacent microlens 16 come into contact with each other, the thickness h1 of the microlens 16 at cross-sections taken along a-a', b-b', and c-c' is the same as each other. In addition, as shown in FIG. 3A, each corner portion of the microlens 16 is opened, that is, gaps in the diagonal direction (c-c') are opened.

Figure 3B:
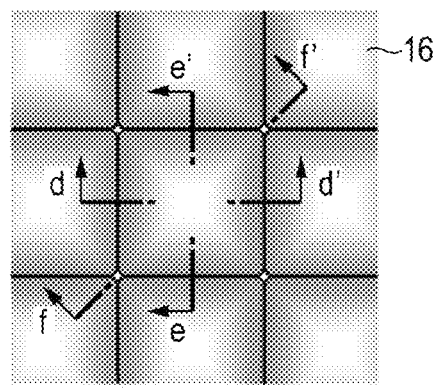
Figure 3C:
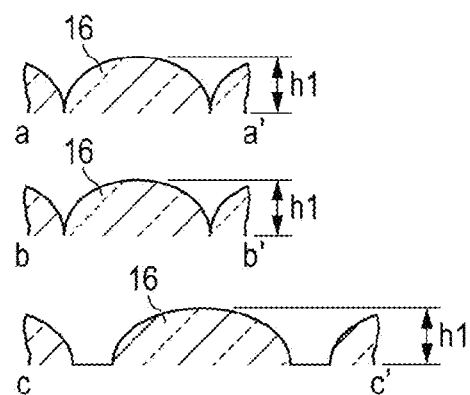

Here, the microlens 16 according to this embodiment is formed by prolonging the etching process after the sides of the adjacent microlenses 16 come into contact with each other as shown in FIG. 3B. Therefore, the gap present at each corner portion of the microlens 16 shown in FIG. 3A becomes narrow.

Figure 3D:
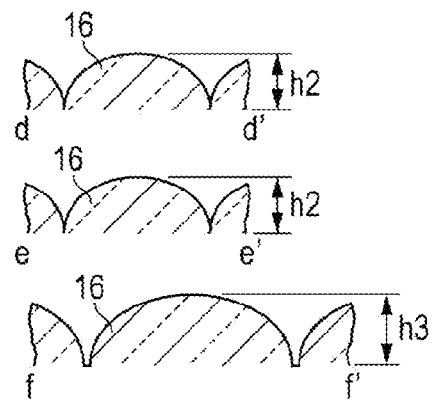

FIG. 3B shows a plan view of the microlens 16 to which the etching process is performed until the gaps in the diagonal direction substantially come into contact with each other. Even when a gap is present between the adjacent microlenses 16, in a case where the gap is 200 nm or less, this value is sufficiently smaller than a wavelength of light, such that the gap does not give an effect to a sensitivity characteristic of the solid-state imaging device. Therefore, it is said that the adjacent microlenses 16 substantially come into contact with each other. FIG. 3D shows cross-sectional views taken along a line d-d', a line e-e', and a line f-f' of the microlens 16 shown in FIG. 3B.

As shown in FIG. 3D, the thickness h2 of the microlens 16 at the cross-section taken along the line d-d' and the line e-e' is the same as each other, and the thickness h3 of the microlens 16 at the cross-section taken along the line f-f' is larger than h2 (h3>h2). In this manner, when the etching process is performed until the corner portions of the adjacent microlenses 16 come into contact with each other, in regard to a position of the bottom that comes into contact with the side of the microlens 16 in a cross-sectional direction of the microlens 16, the microlens 16 having a large film thickness at the bottom position that comes into contact with the corner portion is formed.

When the etching process is prolonged even after the sides of the adjacent microlenses 16 comes into contact with each other, an ineffective region of the microlens 16 is made to be small in a plan view, and thereby an effective region may be enlarged.

Figure 4A:
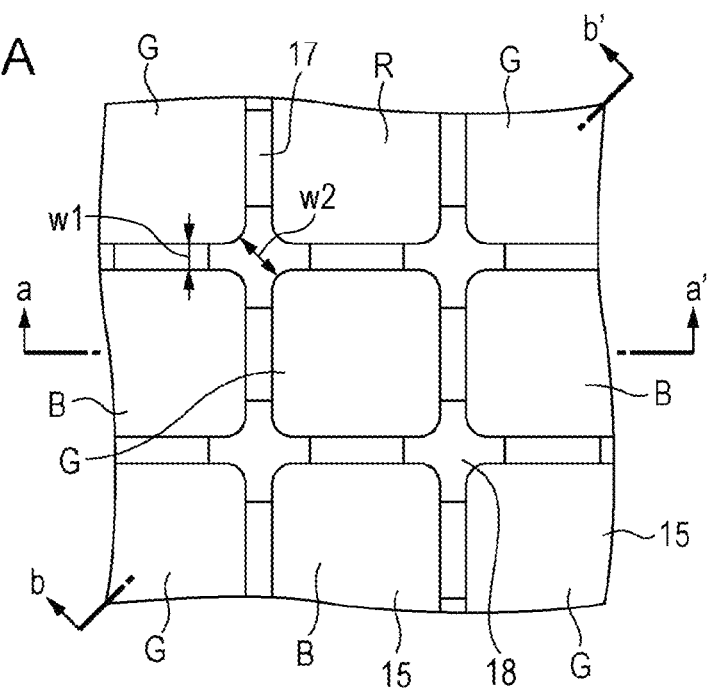
FIGS. 4A to 4C are diagrams illustrating a light shielding film according to the first embodiment of the present disclosure.
Figure 4B:
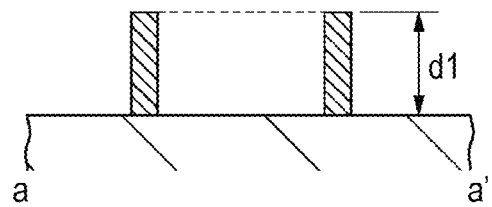
Figure 4C:
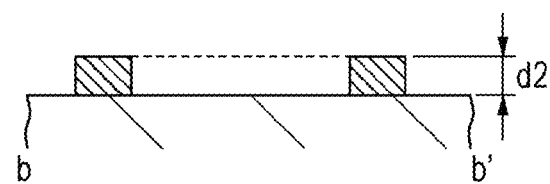

Next, the color filter 15 and the light shielding film according to this embodiment will be described with reference to FIGS. 4A to 4C. FIG. 4A shows a plan view of the color filter 15 and the light shielding film. FIG. 4B shows only the light shielding film in a cross-section taken along a line a-a' (in the side direction of the pixel region) of FIG. 4A, and FIG. 4C shows only the light shielding film in a cross-section taken along a line b-b' (in the diagonal direction of the pixel region).

As shown in FIG. 4A, in the color filter 15, a red filter component R, a green filter component G, and a blue filter component B are bayer-arranged. That is, the color filter 15 has a pattern in which the green filter component G is arranged in a checkered pattern, and the red filter component R and the blue filter component B are line-sequentially arranged.

The light shielding film is formed in the same plane as the color filter 15 at boundaries of the pixels, that is, in the vicinity of the pixel regions. As shown in FIG. 4A, the light shielding film is formed in a lattice pattern.

The light shielding film has the first light shielding portion 17 that is formed at each side portion of the pixel region and the second light shielding portion 18 that is formed at each corner portion of the pixel boundaries.

The first light shielding portion 17 is formed at each side portion of the light shielding film having the lattice pattern. The pixel region has a substantially quadrilateral shape when seen from the microlens 16. A region that includes a side having a substantially quadrilateral shape and has a constant width is referred to as a side portion of the pixel region. The first light shielding portion 17 is formed at each side portion of the pixel region in the same plane as the color filter 15. The first light shielding portion 17 has an end face (a first end face) that comes into contact with the microlens 16, and an end face (a second end face) that is opposite to the first end face and comes into contact with the isolation region 24. The first light shielding portion 17 has a predetermined film thickness d1, and has a substantially tapered shape in which a width of the first end face is narrower than that of the second end face.

The second light shielding portion 18 is formed at each intersection portion of the light shielding portion having the lattice pattern. The second light shielding portion 18 has a predetermined film thickness d2 and has a cross shape in a plan view. The pixel region has a quadrilateral shape when viewed from the microlens 16 side. A region that includes a corner having the cross shape and has a constant width is referred to as a corner portion. The second light shielding portion 18 is formed at each corner portion of the pixel region in the same plane as the color filter 15. The second light shielding portion 18 has an end face (a first end face) that comes into contact with the microlens 16 and an end face (a second end face) that is opposite to the first end face and comes into contact with the isolation region 24.

Each color filter component of the color filter 15 is formed at inner side of the pixel region except for each side portion and corner portion of the pixel region. As shown in FIG. 2A, since the film thickness d1 of the first light shielding portion 17 and the film thickness of the color filter 15 are the same as each other, the microlens 16 side end face of the first light shielding portion 17 and the microlens 16 side face of each of the color filter components are formed to be flush with each other at each side portion of the pixel region.

As shown in FIG. 2B, since the film thickness d2 of the second light shielding portion 18 is smaller than the film thickness of the color filter 15, each of the color filter components is formed to overlap the microlens 16 side end face (the first end face) of the second light shielding portion 18.

In addition, in the solid-state imaging device 1 according to this embodiment, the color filter 15 and the light shielding film are formed above the pixel 2 at the rear surface side of the substrate 11. Therefore, the film thickness of the first light shielding portion 17 and the distance from the surface of the pixel 2 to the end face (the first end face) of the first light shielding portion 17 at the side of the microlens 16 are the same as each other. In addition, the film thickness of the second light shielding portion 18 and the distance from the surface of the pixel 2 to the end face (the first end face) of the second light shielding portion 18 at the side of the microlens 16 are also the same as each other. For example, in a case where an insulation film, a substrate, or the like is provided between the pixel 2, and the color filter and the light shielding film, the film thickness of the first light shielding portion 17 becomes smaller than the distance from the surface of the pixel 2 to the end face (the first end face) of the first light shielding portion 17 at the side of the microlens 16. This is also true of the second light shielding portion 18.

Next, an effect of making the film thickness d2 of the second light shielding portion 18 smaller than the film thickness d1 of the first light shielding portion 17 (d2<d1) will be described with reference to FIGS. 5A to 5D.

Figure 5A:
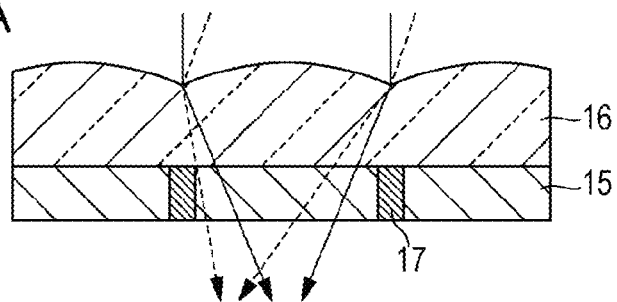
FIGS. 5A to 5D are cross-sectional views of the solid-state imaging device according to the first embodiment of the present disclosure.
Figure 5B:
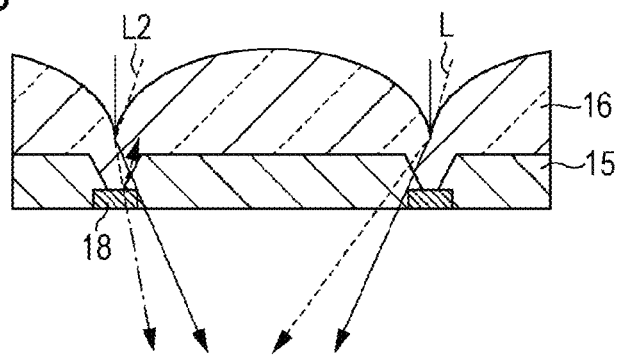

FIGS. 5A and 5B show diagrams illustrating a cross-section of the microlens 16, the color filter 15, and the light shielding film of the solid-state imaging device 1 according to this embodiment. FIG. 5A is a cross-sectional view of the solid-state imaging device 1, which is taken along the line d-d' (or the line e-e') in FIG. 3B, and the line a-a' in FIG. 4A. FIG. 5B shows a cross-sectional view of the solid-state imaging device 1, which is taken along the line f-f' in FIG. 3B and the line b-b' in FIG. 4A.

Figure 5C:
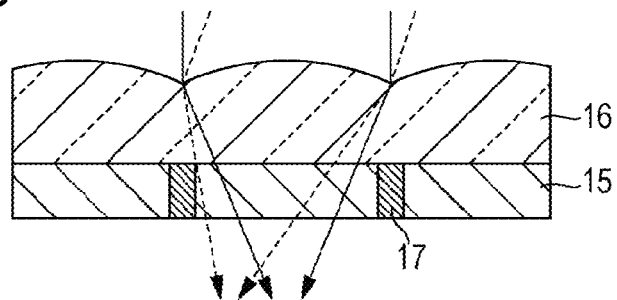
Figure 5D:
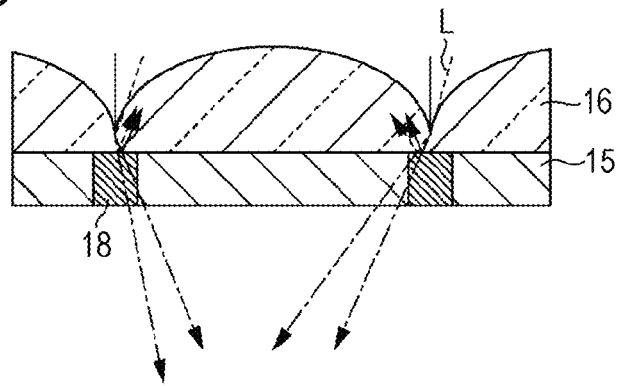

FIGS. 5C and 5D illustrate the solid-state imaging device 1 in a case where the film thickness d2 of the second light shielding portion 18 is made to be equal to the film thickness d1 of the first light shielding portion 17 (d1=d2). A configuration shown in FIGS. 5A and 5B is the same as that shown in FIGS. 5C and 5D except for the film thickness d2 of the second light shielding portion 18.

In FIGS. 5A to 5D, in the incident light, light that is vertically incident in light that is condensed through the microlens 16 is indicated by solid lines, and light (obliquely incident light) in which a main light beam is inclined and which is obliquely incident is indicated by broken lines.

As shown in FIGS. 5A and 5C, in a face (a cross-section in the side direction of the pixel region) that passes through the center of the microlens 16 of the solid-state imaging device 1 and that is parallel with the pixel boundary, the light is incident to the color filter 15 without being interrupted by the light shielding film in both of the obliquely incident light and the vertically incident light.

As shown in FIG. 5D, in a face (a cross-section in the diagonal direction of the pixel region) that passes through the center of the microlens 16 of the solid-state imaging device 1 and the diagonal line of the pixel region, the incident light is interrupted by the light shielding film and therefore so-called shading occurs. Particularly, at each corner portion of the microlens 16, both of the vertically incident light and the obliquely incident light are reflected by the light shielding film, such that the light sensitivity of the solid-state imaging device 1 decreases.

The light shielding film is formed by forming a resist pattern using a lithography method after forming a light shielding layer on the substrate 11, and performing an etching process using a dry etching method. In the resist pattern formed by the lithography method, an opening portion has a round shape in order for an opening to be small in a plan view (refer to FIG. 4A). Therefore, the width w2 of the light shielding film in the diagonal direction is formed to be relatively wider than the width w1 of the light shielding film in the side direction. In this manner, since the line width w2 of the second light shielding portion 18 becomes wider than the line width w1 of the first light shielding portion 17, the majority of the light that is incident from the corner portion of the microlens 16 is reflected by the second light shielding portion 18, and therefore the light sensitivity of the solid-state imaging device 1 decreases.

On the other hand, as shown in FIG. 5B, when the film thickness d2 of the second light shielding portion 18 is made to be smaller than the film thickness d1 of the first light shielding portion 17, a portion of the incident light, which is interrupted by the light shielding film, decreases. Particularly, at the corner portion of the microlens 16, the vertically incident light is transmitted through the color filter 15 without being interrupted by the light shielding film. In addition, a part of the obliquely incident light is reflected by the light shielding film, but the obliquely incident light L, which is not transmitted through in FIG. 5D, is transmitted through the color filter 15.

In this manner, when the film thickness d2 of the second light shielding portion 18 is made to be small, it is possible to reduce the incident light that is reflected by the light shielding film, such that the decrease in the light sensitivity of the solid-state imaging device 1 may be suppressed. In addition, the film thickness d1 of the first light shielding portion 17 is made to have the same film thickness as the color filter 15 without making the film thickness d1 small, such that it is possible to reduce the color mixture in which the incident light is leaked to an adjacent photoelectric conversion element PD.

Figure 6:
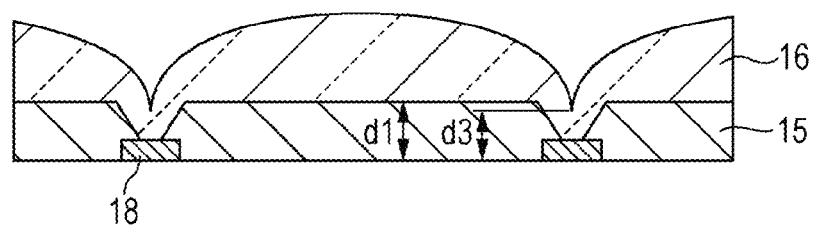
FIG. 6 is a cross-sectional view of the solid-state imaging device according to the first embodiment of the present disclosure.

Furthermore, when the film thickness d2 of the second light shielding portion 18 is made to be smaller than that of the color filter 15, a region where the color filter 15 is not formed above the second light shielding portion 18. Therefore, as shown in FIG. 6, the corner portion of the microlens 16 may be formed in the region where the color filter 15 is not formed above the second light shielding portion 18. That is, a distance d3 from a face of the color filter 15 at the side of the photoelectric conversion element PD to the corner portion of the microlens 16 may be shorter than the film thickness d1 of the color filter 15. Therefore, the lowering of the solid-state imaging device may be realized.

Next, a method of manufacturing the solid-state imaging device 1 according to this embodiment will be described with reference to FIGS. 7A to 7F. In addition, the pixel portion 3 may be formed similarly to the related art, such that the description thereof will be omitted.

First, a first method of manufacturing the first and second light shielding portions 17 and 18 of the solid-state imaging device 1 will be described with reference to FIGS. 7A to 7F. (a) of FIGS. 7A to 7F shows a cross-sectional view of the pixel region in the side direction, (b) of FIGS. 7A to 7F shows a cross-sectional view of the pixel region in the diagonal direction. Broken lines in FIGS. 7A to 7F represent boundaries of the pixel region.

As shown in FIG. 7A, first, an insulation film 30 is formed on the substrate 11 (not shown). The insulation film 30 may be formed in a single layer or multi layers. For example, the insulation film 30 may be formed in two layers including a silicon oxide film formed on the substrate 11 and a hafnium oxide film laminated on the silicon oxide film. In this case, the silicon oxide film and the hafnium oxide film are formed to have a predetermined film thickness so as to reduce the reflection of incident light, respectively.

Next, a light shielding film 31 is formed on the insulation film 30. The light shielding film 31 is formed of a material interrupting the incident light. For example, in a case where a conductive material is used as the light shielding film 31, aluminum, tungsten, or the like is used. In addition, in a case where an organic material is used as the light shielding film 31, materials in which a black coloring material is dispersed such as an organic film including carbon black or titanium black are used.

As shown in FIG. 7B, a first photoresist 32 is formed on the light shielding film 31. The first photoresist 32 has a cross shape like the second light shielding portion 18, and has an opening portion at the corner portion of the pixel region, in which the width of the cross shape is larger than that of the second light shielding portion 18 ((b) in FIG. 7B).

The light shielding film 31 that is an underlying layer of the first photoresist 32 is dry-etched by using the first photoresist 32 as a mask (refer to FIG. 7C). Here, as shown (b) of FIG. 7C, the dry etching is performed in order for the etching to be terminated at a depth that is equal to or less than the thickness of the light shielding film 31. Therefore, a concave hole is formed in the light shielding film 31.

When the dry etching is terminated, the first photoresist 32 is removed and a second photoresist 33 is formed on the light shielding film 31. The second photoresist 33 is formed at each side portion of the pixel region to have the same shape as the first light shielding portion 17 and at each corner portion of the pixel region to have the same shape as the second light shielding portion 18. Therefore, the portion, which is formed at the corner portion of the pixel region in the second photoresist 33, is at an inner side of the concave hole of the light shielding film 31 (refer to (c) of FIG. 7D).

As shown in FIG. 7E, the light shielding film 31 that is an underlying layer of the second photoresist 33 is dry-etched using the second photoresist 33 as a mask, and as shown in FIG. 7F, when the second photoresist 33 is removed, the first light shielding portion 17 and the second light shielding portion 18 are formed.

In this manner, two times of photoresist patterning and two times of dry-etching are performed, respectively, and thereby it is possible to form the first light shielding portion 17 and the second light shielding portion 18 which have a different thickness.

Next, a different method (a second manufacturing method) of manufacturing the first and second light shielding portions 17 and 18 of the solid-state imaging device 1 with reference to FIGS. 8A to 8F. (a) of FIGS. 8A to 8F shows a cross-sectional view of the pixel region in the side direction, (b) of FIGS. 8A to 8F shows a cross-sectional view of the pixel region in the diagonal direction. Broken lines in FIGS. 8A to 8F represent boundaries of the pixel region. FIG. 8A is substantially the same as FIG. 7B, and description thereof will not be repeated.

As shown in FIG. 8B, a first photoresist 34 is formed on the light shielding film 31. The first photoresist 34 is formed at boundaries of pixel region and has a lattice shape having a constant thickness.

The light shielding film 31 that is an underlying layer of the first photoresist 34 is dry-etched using the first photoresist 34 as a mask (refer to FIG. 8C). Here, the etching is terminated at a depth that is equal to the thickness of light shielding film 31 differently from (b) of FIG. 7C. Therefore, the light shielding film 31 has a lattice shape having a constant thickness.

When the dry etching is terminated, the first photoresist 34 is removed, and a second photoresist 35 is formed on the light shielding film 31. The second photoresist 35 has an opening portion of a cross shape like the second light shielding portion 18 at each corner portion of the pixel region.

The light shielding film 31 that is an underlying layer of the second photoresist 35 is dry-etched using the second photoresist 35 as a mask. Here, the light shielding film 31 is etched to be thinner than the first light shielding portion 17. Therefore, the second light shielding portion 18, which has the film thickness smaller than that of the first light shielding portion 17, is formed.

As shown in FIG. 8F, the second photoresist 35 is removed after the dry etching, and therefore the first light shielding portion 17 and the second light shielding portion 18 are formed.

In this manner, first, the light shielding film 31 having the lattice shape, and then the first light shielding portion 17 and the second light shielding portion 18, which have a different thickness, may be formed.

Figure 9A:
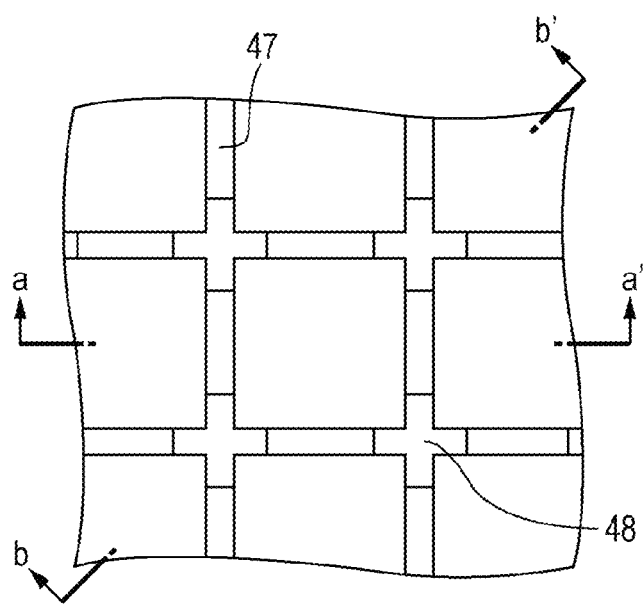
FIGS. 9A to 9C are diagrams illustrating a photoresist of the light shielding film according to the first embodiment of the present disclosure.
Figure 9B:
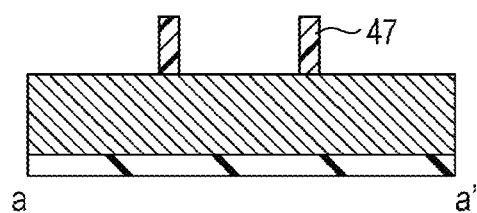
Figure 9C:
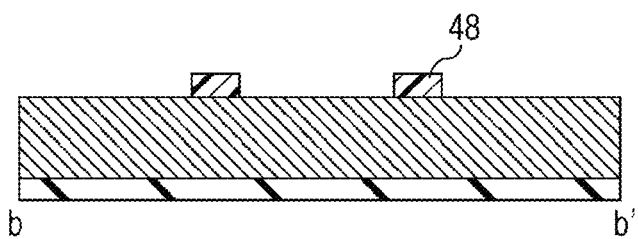

A third method of manufacturing the first and second light shielding portions 17 and 18 will be described with reference to FIGS. 9A to 9C. FIG. 9A shows a plan view of a photoresist 46, FIG. 9B shows a cross-sectional view in the side direction, and FIG. 9C shows a cross-sectional view in the diagonal direction. A method of forming the light shielding film 31 is the same as FIG. 7A.

A photoresist 46 to form a photoresist 46 shown in FIGS. 9A to 9C on the light shielding film 31 includes a first resist 48 that is formed at each side portion of the pixel region and has a constant thickness, and a second resist 49 that is formed at each corner portion of the pixel region and has a thickness smaller than that of the first resist 48. The first and second light shielding portions 17 and 18 are formed by using the photoresist 46 as a mask and by adjusting a dry etching condition (etching selection ratio of the photoresist 46 and the light shielding film 31) of the light shielding film 31. Therefore, it is possible to form the first light shielding portion 17 and the second light shielding portion 18, which have a different thickness, by one time of dry etching.

Next, a fourth method of manufacturing the first light shielding portion 17 and the second light shielding portion 18 will be described with reference to FIGS. 10A to 10C. This fourth manufacturing method is different from the first to third manufacturing methods in that protrusion portion 40 is formed before forming the light shielding film 31.

Figure 10A:
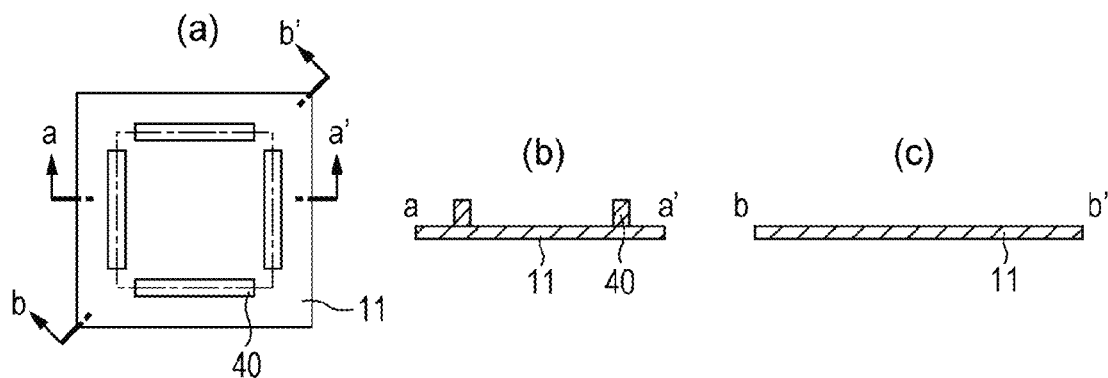
FIGS. 10A to 10C are manufacturing process diagrams of the light shielding film according to the first embodiment of the present disclosure.
Figure 10B:
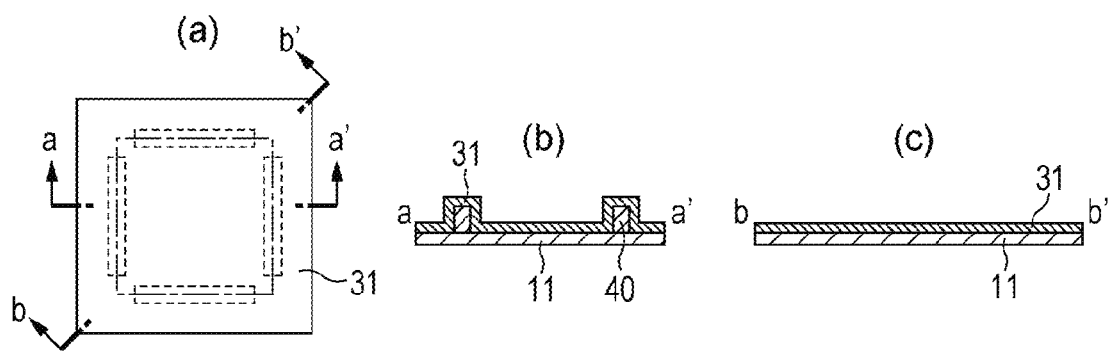
Figure 10C:
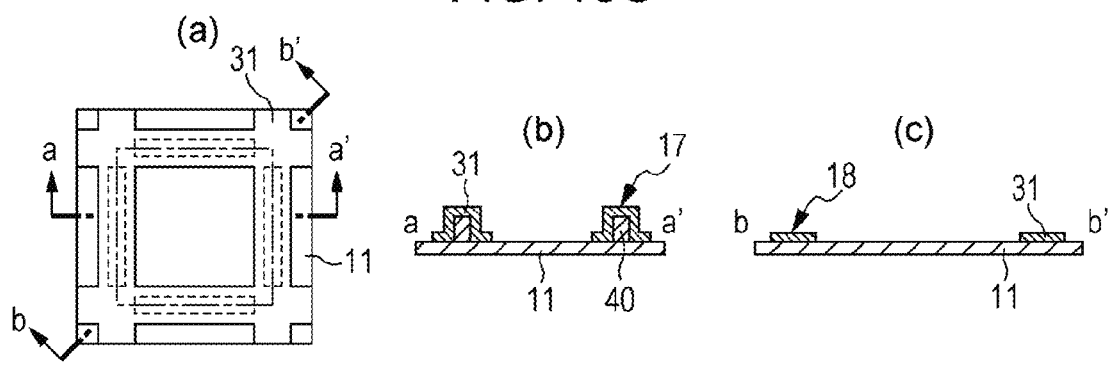

(a) of FIGS. 10A to 10C shows a plan view when the pixel region is viewed from a direction in which the microlens is to be formed, (b) of FIGS. 10A to 10C shows a cross-sectional view of the pixel region in the side direction (a-a' direction in FIG. 10A), and (c) of FIGS. 10A to 10C shows a cross-sectional view of the pixel region in the diagonal direction (b-b' direction in FIG. 10A). Broken lines in FIGS. 10A to 10C represent boundaries of the pixel region.

First, the protrusion portion 40 is formed on the substrate 11 in which the pixel portion 3 is formed (refer to FIG. 10A). The protrusion portion 40 is formed of, for example, a silicon oxide film or the like. The protrusion portion 40 is formed in a rectangular parallelepiped shape having a constant thickness at each side portion of the pixel region on the substrate 11.

Next, the insulation film 30 is formed on the substrate 11 and the protrusion portion 40 (refer to FIG. 10B). After forming the insulation film 30, the insulation film 30 formed at an inner side of the pixel region is removed (refer to FIG. 10C).

In this manner, the first light shielding portion 17, which has the thickness equal to the thickness of the protrusion portion 40 and the thickness of the light shielding film 31, is formed at the side portion of the pixel region, and the second light shielding portion 18, which has the same thickness as the light shielding film 31, is formed at each corner portion of pixel region.

The color filter 15 is formed after the first and second light shielding portions 17 and 18 are formed by the first to fourth methods. Hereinafter, an example of a method of forming the color filter 15 will be described with reference to FIGS. 11A to 11E. (a) of FIGS. 11A to 11E shows a cross-sectional view of the pixel region in the side direction, and (b) of FIGS. 11A to 11E shows a cross-sectional view of the pixel region in the diagonal direction.

As shown in FIG. 11A, a photopolymerization negative type photoresist (Green photoresist 41) in which a plurality of pigments are added so as to have a spectral characteristic of the first color filter component (here, Green) is applied onto the insulation film 30, and the first and second light shielding portions 17 and 18.

Next, the Green photoresist 41 is patterned using a photolithography method. Here, the Green photoresist 41, which is surrounded by the first and second light shielding portions 17 and 18, is patterned so as to be arranged in a checkered pattern. As shown in (a) and (b) of FIG. 11B, a pattern edge of the Green photoresist 41 is formed on each end face of the first and second light shielding portions 17 and 18 at the side of the microlens 16. That is, the Green photoresist 41 partially comes into contact with the end face of the first and second light shielding portions 17 and 18 at the side of the microlens 16.

As shown in FIG. 11C, a photopolymerization negative type photoresist (Blue photoresist 42) in which a plurality of pigments are added so as to have a spectral characteristic of the second color filter component (here, Blue) is applied onto the insulation film 30, the first and second light shielding portions 17 and 18, and the Green photoresist 41.

Next, the Blue photoresist 42 is patterned using a photolithography method. Here, the Blue photoresist 42 surrounded by the first and second light shielding portions 17 and 18 is patterned so as to be line-sequentially disposed.

Consequently, a photopolymerization negative type photoresist (Red photoresist) in which a plurality of pigments are added so as to have a spectral characteristic of the third color filter component (here, Red) is formed. A method of forming the Red photoresist is the same as the method of forming the Blue photoresist 42, such that the description thereof will not be repeated.

As shown in FIG. 11E, a planarization process is performed with respect to the Green, Blue, and Red photoresists using a CMP (Chemical Mechanical Polishing) or a dry etching method. The planarization process is performed until the color filter 15 has the same film thickness as the first light shielding portion 17. In a case where each photoresist is planarized using the CMP, the end face of the first light shielding portion 17 at the side of the microlens 16 serves as a polishing stopper.

Figure 12A:
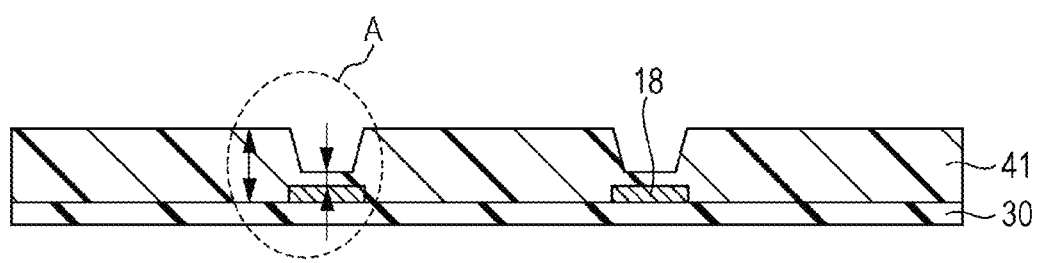
FIGS. 12A and 12B are cross-sectional views of the color filter according to the first embodiment of the present disclosure.

In addition, as shown in FIG. 12A, in a case where a pattern adhesion property of the Green photoresist 41 in FIG. 11B is bad, the Green photoresist 41 in the diagonal direction of the pixel region may be connected. Therefore, an adhesion area of the Green photoresist 41 is enlarged.

For example, when performing the patterning of the Green photoresist 41, a line width (a line width at the time of being reduced by a stepper) at the connection portion of the photomask is set to 0.3 microns or less, and then i-rays exposing is performed. Therefore, in the Green photoresist 41, the film thickness thereof at the corner portion (the connection portion of the photomask) of the pixel region becomes smaller than that at an inner side of the pixel region (refer to (a) FIG. 12A).

This is because the Green photoresist 41 is the photopolymerization negative type photoresist. When the line width of the connection portion of the photomask is set to 0.3 microns or less, from a viewpoint of a resolution of the Green photoresist 41, a resolution at the time of the i-rays exposing, or the like, the Green photoresist 41 may not obtain a sufficient exposing energy and a sufficient photopolymerization reaction in the resist film is not promoted. Therefore, in the Green photoresist 41, the film thickness thereof at the corner portion (the connection portion of the photomask) of the pixel region becomes smaller than that at the inner side of the pixel region.

Figure 12B:
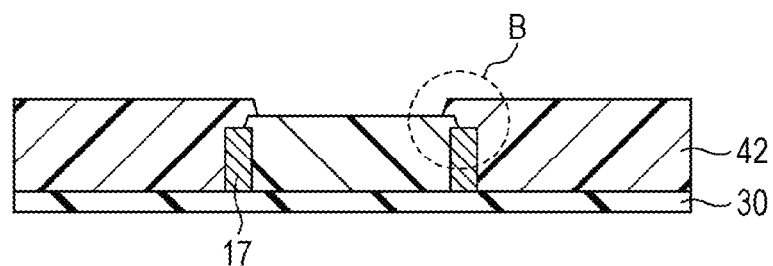

In addition, as shown in FIG. 12B, when the Blue photoresist 42 in FIG. 11C is patterned, the Blue photoresist 42 may be patterned to overlap the Green photoresist 41 (particularly, refer to "B" of FIG. 12B). This is because, the color filter 15, which is located at a position higher than the end face of the first light shielding portion 17 at the side of the microlens 16, is removed due to the planarization process as shown in FIG. 11E.

In addition, although not shown, the Red photoresist may also overlap the Green photoresist 41 and the Blue photoresist 42. The Red photoresist and the Green photoresist 41 overlap each other above the end face of the first light shielding portion 17 at the side of the microlens 16. The Red photoresist and the Blue photoresist 42 overlap each other above the end face of the second light shielding portion 18 at the side of the microlens 16.

In the above-described example of forming the color filter 15, the color filter components are formed in the order of Green, Blue, and Red, but the formation sequence of the color filter components is not limited thereto.

A method of forming the microlens 16 will be described with reference to FIGS. 13A to 13F. (a) of FIGS. 13A to 13F shows a cross-sectional view of the pixel region in the side direction and (b) of FIGS. 13A to 13F shows a cross-sectional view of the pixel region in the diagonal direction.

As shown in FIG. 13A, after forming the color filter 15, a microlens base material 43 is formed on the color filter 15. As the microlens base material 43, a polystyrene-based resin, a novolac-based resin, a copolymer resin of these resins and acryl-based resin, a resin obtained by applying an aromatic ring to a side chain of the acryl-based resin, or the like may be used.

As shown in FIG. 13B, a positive type photoresist 44 is applied on the microlens base material 43. As the positive type photoresist 44, for example, a novolac resin as a main component is used.

Next, the positive type photoresist 44 is patterned in correspondence with each pixel using a photolithography method (refer to FIG. 13C).

The patterned positive type photoresist 44 is subjected to a heat treatment at a temperature higher than the thermal softening point thereof, and thereby a lens-shaped positive type photoresist 44 is formed (refer to FIG. 13D). A line width of the positive type photoresist 44 in the side direction (w1) of the pixel region is narrower than that in the diagonal direction (w2) of the pixel region.

The lens shape is pattern-transferred to the microlens base material 43 that is an underlying layer by using the lens-shaped positive type photoresist 44 as a mask with a dry etching method (refer to FIG. 13E). Since the line width of the positive type photoresist 44 in the side direction (w1) of the pixel region is narrower than that in the diagonal direction (w2), lenses adjacent to each other in the side direction of the pixel region substantially does not have a gap, but lenses adjacent to each other in the diagonal direction has a gap.

In the solid-state imaging device 1 according to this embodiment, to remove the gap between lenses adjacent to each other in the diagonal direction, etching is continuously performed. As shown in FIG. 13F, the etching is continuously performed even after the gap between the lenses adjacent to each other in the side direction substantially disappears, such that the gap between the lenses adjacent to each other in the diagonal direction becomes substantially zero.

When the microlens 16 is performed as described above, in the microlens 16, the thickness h4 thereof at each side portion of the pixel boundaries becomes larger than the thickness h5 at each corner portion. That is, the height of the top surface in each microlens 16 becomes equal, and the bottom surface (place where the adjacent microlenses 16 come into contact with each other) of the microlens 16 formed at each corner portion of the pixel region is located at a position (position relatively close to the color filter 15) lower than the bottom surface of the microlens 16 formed at each side portion of the pixel region.

As described above, according to the solid-state imaging device 1 related to the first embodiment, the first light shielding portion 17 is provided at each side portion of the pixel region, and the second light shielding portion 18, which is thinner than the first light shielding portion 17, is provided at each corner portion of the pixel region, such that it is possible to reduce the incident light that is reflected by the light shielding film without using lens other than the microlens 16, and therefore it is possible to suppress the decrease in the light sensitivity of the solid-state imaging device 1. In addition, the first light shielding portion 17 has the same film thickness as the color filter 15 without making the film thickness of the first light shielding portion 17 small, such that it is possible to reduce the color mixture in which the incident light is leaked to the adjacent photoelectric conversion element PD.

In the solid-state imaging device 1 according to this embodiment, the distance d3 from the face of the color filter 15 at the side of the photoelectric conversion element PD to the corner portion of the microlens 16 may be shorter than the film thickness d1 of the color filter 15, such that it is possible to form the microlens 16 with a relatively small thickness. Therefore, the solid-state imaging device 1 may be made to be further thin.

First Modification

Next, a first modification of the first embodiment will be described with reference to FIGS. 14A and 14B.

It may be difficult to make the film thickness of the color filter 15 equal to that of the first light shielding portion 17 as shown in FIGS. 11A to 11E. Commonly, the color filter 15 is formed using a photolithography method. A photosensitive resin (so-called photoresist) in which a coloring agent (pigment or dye) is added becomes a material of the color filter 15.

In a case where a photopolymerization negative type photoresist containing a photosensitive resin as a base component is used as the material of the color filter 15, a coloring agent, a dispersed resin, a monomer, a photopolymerization initiator, an additive agent, or the like may be contained in the solid content of the color filter 15.

The spectral characteristics of the color filter 15 are different in each color filter component, such that the same pigment may be commonly used, but a kind of the pigment or an additive amount of the pigment, which is added to the solid content, are different in each case.

Since the kind of the pigment and the additive amount thereof are different in each case, the additive amount of the dispersion resin, the monomer, the photopolymerization initiator, the additive agent, and the like, which are contained in the solid content of the color filter 15, or the kind thereof may be different.

The photosensitive resin to which the pigment is added is commonly patterning-exposed using ultraviolet rays (for example, i-rays). Since the pigment absorbs ultraviolet rays, in a case where the photopolymerization negative type resist, which contains the photosensitive resin as a base component, is patterning-exposed, a polymerization reaction at an exposed portion does not progress effectively.

In regard to a common photosensitive resin, a material composition thereof is determined by making much account of a patterning characteristic, but it is difficult to secure the patterning characteristic of the photosensitive resin to which the pigment is added due to an effect of the added pigment.

In addition, to improve the characteristics of the solid-state imaging device 1, it is necessary to make the thickness from the microlens 16 to the pixel portion 3 small. It is preferable to make the film thickness of the color filter 15 small. To make the film thickness of the color filter 15 small while maintaining the spectral characteristic, it is necessary to make the concentration of the pigment contained in the color filter 15 thick.

When the concentration of the pigment of the color filter 15 is made to be thick, the absorption of the ultraviolet rays increases, and therefore the securing of the patterning characteristic becomes further difficult.

Therefore, in this modification, description will be given with respect to an example of a case in which the planarization process of the color filter 15 is not performed, and the film thickness of the color filter 15 is made to be larger than that of the first light shielding portion 17.

A method of forming the color filter 15 is similar to FIGS. 11A to 11D. However, in a case where the Green photoresist 41, the Blue photoresist 42, and the Red photoresist are formed to overlap each other, the planarization process may be performed to a degree in which the respective photoresists do not overlap each other.

Figure 14A:
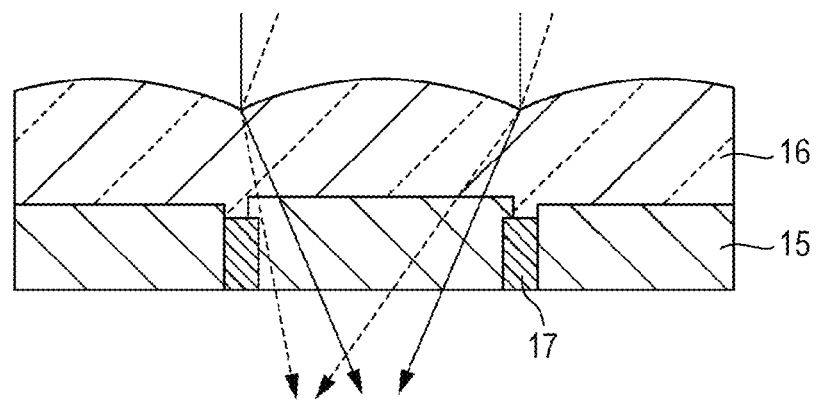
FIGS. 14A and 14B are cross-sectional views of a solid-state imaging device according to a first modification of the first embodiment of the present disclosure.
Figure 14B:
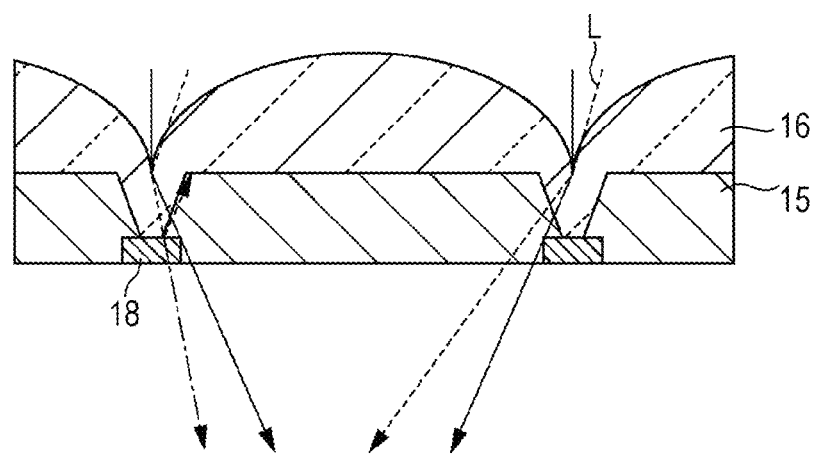

FIGS. 14A and 14B show cross-sectional views of the solid-state imaging device 1 in a case where the planarization process with respect to the color filter 15 is not performed. FIG. 14A shows a cross-sectional view of the solid-state imaging device 1 in the side direction of the pixel region, and FIG. 14B shows a cross-sectional view of the solid-state imaging device 1 in the diagonal direction.

As shown in FIGS. 14A and 14B, even when the planarization process with respect to the color filter 15 is not performed, it is possible to obtain the same effect as the first embodiment.

Second Modification

Figure 15A:
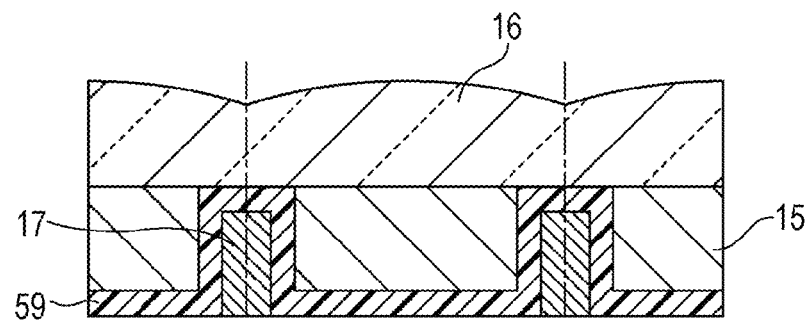
FIGS. 15A and 15B are cross-sectional views of a solid-state imaging device according to a second modification of the first embodiment of the present disclosure.
Figure 15B:
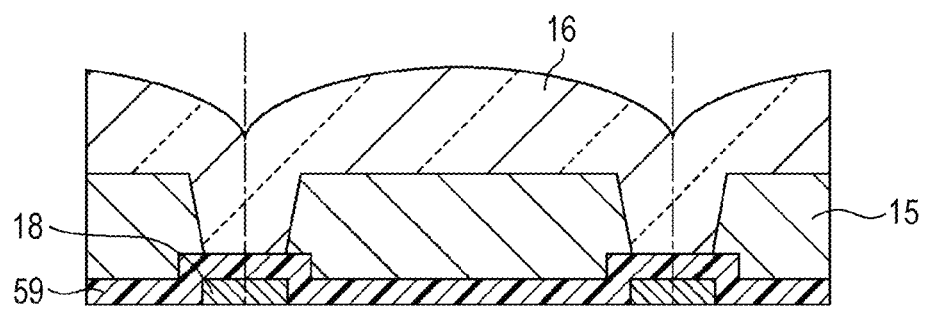

Next, a second modification of the first embodiment will be described with reference to FIGS. 15A and 15B. FIG. 15A shows a cross-sectional view of a solid-state imaging device according to this modification in the side direction, and FIG. 15B shows a cross-sectional view thereof in the diagonal direction.

The solid-state imaging device according to this modification is different from the first embodiment in that a film 59 having a refraction index lower than that of the color filter 15 is provided between the light shielding film and the color filter 15. As a material of the film 59, a silicon oxide film (SiO), a silicon oxycarbide film (SiOC), an acryl-based resin, or the like may be exemplified.

The film 59 is formed after the first light shielding portion 17 and the second light shielding portion 18 are formed. For example, in a case where the film 59 is formed of the silicon oxide film, the silicon oxycarbide film, or the like, the film 59 may be formed using a plasma CVD method, and in a case where the film 59 is formed of the acryl-based resin or the like, the film 59 is formed using an application method.

Figure 16A:
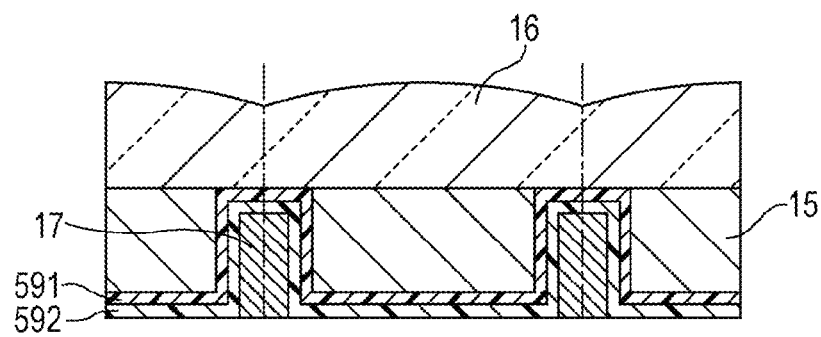
FIGS. 16A and 16B are cross-sectional views of the solid-state imaging device according to the second modification of the first embodiment of the present disclosure.
Figure 16B:
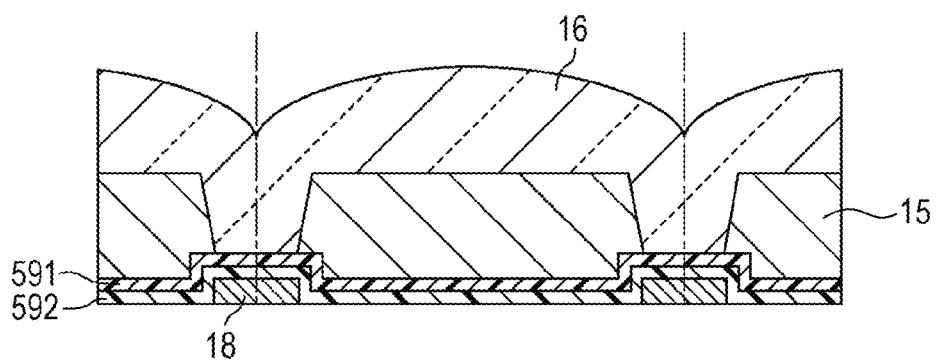

In addition, another example of the second modification is shown in FIGS. 16A and 16B. The film 59 may be formed by laminating a plurality of films. In FIGS. 16A and 16B, a film in which two layers, which includes a film 591 that is formed of the acryl-based resin, and a film 592 that is formed of the silicon oxide film (SiO), the silicon oxycarbide film (SiOC), or the like, are laminated is used as the film 59.

Figure 17A:
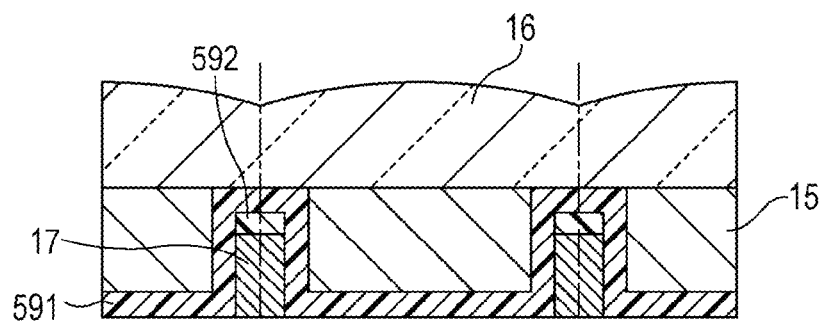
FIGS. 17A and 17B are cross-sectional views of the solid-state imaging device according to the second modification of the first embodiment of the present disclosure.
Figure 17B:
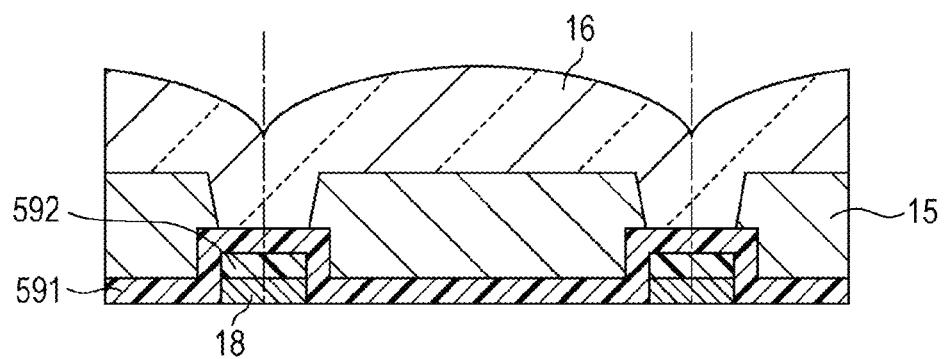

Furthermore, still another example of the second modification is shown in FIGS. 17A and 17B. In FIGS. 17A and 17B, the film 592 is provided on the first end face of each of the first light shielding portion 17 and the second light shielding portion 18, this configuration is different from that of the solid-state imaging device shown in FIGS. 16A and 16B. As shown in FIGS. 17A and 17B, the film 592 is provided on the first end face of each of the first light shielding portion 17 and the second light shielding portion 18, the height reduction of the solid-state imaging device may be realized while maintaining the desired film thickness of the color filter 15.

As described above, after forming the light shielding film, the film 59 having the refraction index lower than that of the color filter 15 is formed to form the color filter 15, it becomes easy for the incident light to be totally reflected by the film 59, such that a condensing rate of the solid-state imaging device may be improved. In addition, the adhesion property between the color filter 15 and the insulation film may be improved.

Second Embodiment

A solid-state imaging device 100 according to a second embodiment of the present disclosure will be described with reference FIGS. 18 to 20. The solid-state imaging device 100 according to this embodiment has the same configuration as the solid-state imaging device 1 according to the first embodiment except for a color filter, and may be manufactured by the same manufacturing method as the first embodiment, such that like reference numerals will be given to like parts having substantially same functions, and redundant description thereof will be omitted.

In a color filter 50 of the solid-state imaging device 100 according to this embodiment, second and third color filter components are surrounded by a first color filter component, and the first color filter component has a hole formed at each corner portion of the pixel region.

Figure 18:
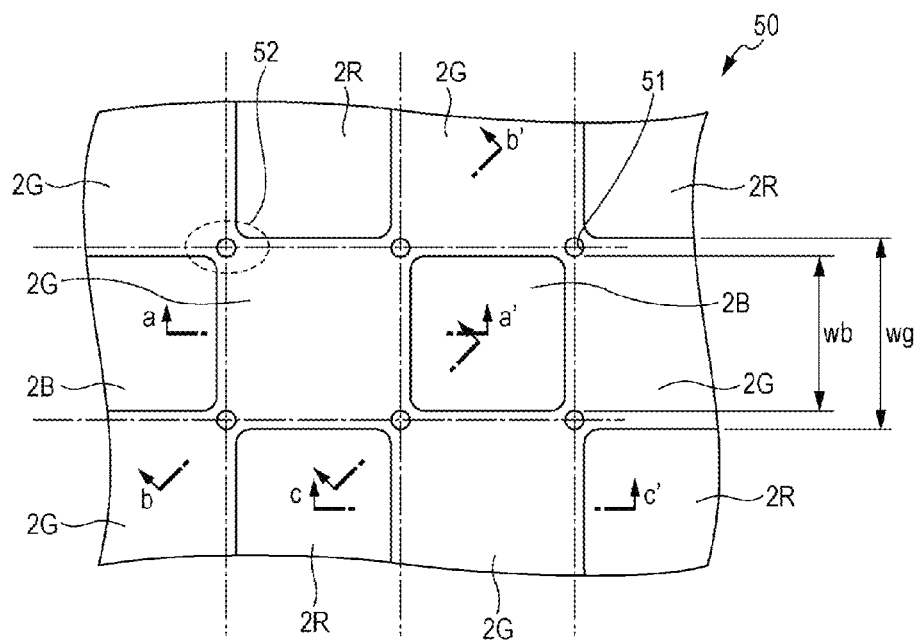
FIG. 18 is a diagram illustrating a color filter according to a second embodiment of the present disclosure.
Figure 19A:
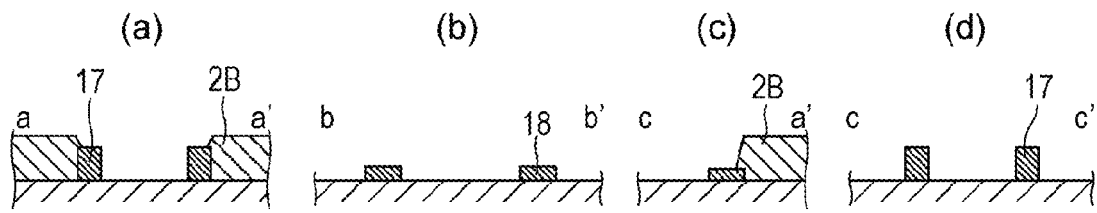
FIGS. 19A to 19F are manufacturing process diagrams of the color filter according to the second embodiment of the present disclosure.

FIG. 18 is a plan view of the color filter 50. Broken lines in FIG. 18 represent boundaries of respective pixel regions. The color filter 50 includes a green filter component 2G in which a hole 51 is formed, a blue filter component 2B, and a red filter component 2R.

The color filter 50 is formed in a pattern in which the blue filter component 2B and the red filter component 2R are surrounded by the green filter component 2G. That is, the green filter component 2G, the blue filter component 2B, and the red filter component 2R are formed to have substantially a square shape, respectively. Among these, as a whole, adjacent four corner portion 52 of green filter components 2G come into contact with each other, such that the green filter components 2G are integrally formed in succession. Therefore, the blue filter component 2B and the red filter component 2R have an area narrower than that of the green filter component 2G, respectively, in a unit filter component aspect, and are separately formed with being surrounded by the green filter component 2G, respectively.

The four corner portions 52 of the green filter component 2G are formed at corner portions of the pixel region. The four corner portions 52 of the green filter component 2G have the hole 51, respectively.

As a material to form the respective filter components 2R, 2G, and 2B, a material not containing a photosensitive component in a material solid component may be used. A filter component material may be configured by a photocuring material including a pigment dispersing agent, a binder resin, a monomer, a photopolymerization initiator, and a solvent. In addition, the filter component material may be configured by a thermosetting type material including a pigment dispersing agent, a binder resin, a thermosetting agent, and a solvent.

As the binder resin, for example, an acryl-based resin, a novolac-based resin, a styrene-based resin, or a copolymer resin thereof may be used. As the thermosetting agent, for example, a melamine-based setting agent, a urea-based setting agent, an epoxy-based setting agent, or the like may be used. As the solvent, for example, ethyl lactate and dimethylformamide may be used.

Next, a method of manufacturing the solid-state imaging device 100 according to this embodiment will be described with reference to FIG. 19A to FIG. 20. In addition, the method of manufacturing the solid-state imaging device 100 according to this embodiment is the same as the first embodiment except for the method of manufacturing the color filter 50. (a) of FIGS. 19A to 19F shows a cross-sectional view of the color filter 50, which is taken along a-a' in FIG. 18. (b) of FIGS. 19A to 19F shows a cross-sectional view of the color filter 50, which is taken along b-b' in FIG. 18. (c) of FIGS. 19A to 19F shows a cross-sectional view of the color filter 50, which is taken along c-a' in FIG. 18. (d) of FIGS. 19A to 19F shows a cross-sectional view of the color filter 50, which is taken along c-c' in FIG. 18.

First, as shown in FIG. 19A, the blue filter component 2B is formed on the substrate 11. A photopolymerization negative type photoresist (blue photoresist) in which a plurality of pigments are added so as to have a spectral characteristic of the blue filter component 2B is applied onto the substrate 11. Next, the blue photoresist is patterned in order for the blue filter component 2B to be arranged as shown in FIG. 18 using a photolithography method. Each pattern edge of the blue photoresist is formed on the end faces of the first light shielding portion 17 and the second light shielding portion 18 at the side of the microlens 16. That is, the blue photoresist partially comes into contact with the end face of the first light shielding portion 17 and the second light shielding portion 18 at the side of the microlens 16.

Figure 19B:
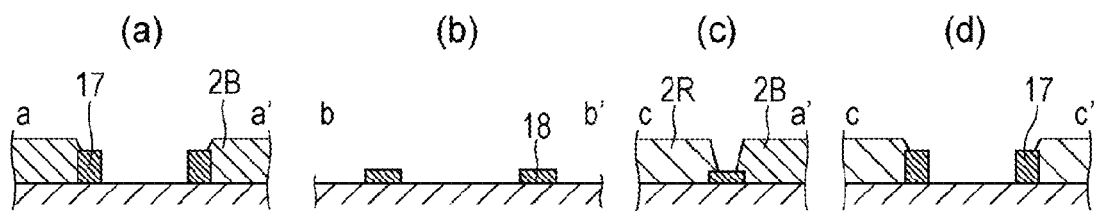
Figure 20:
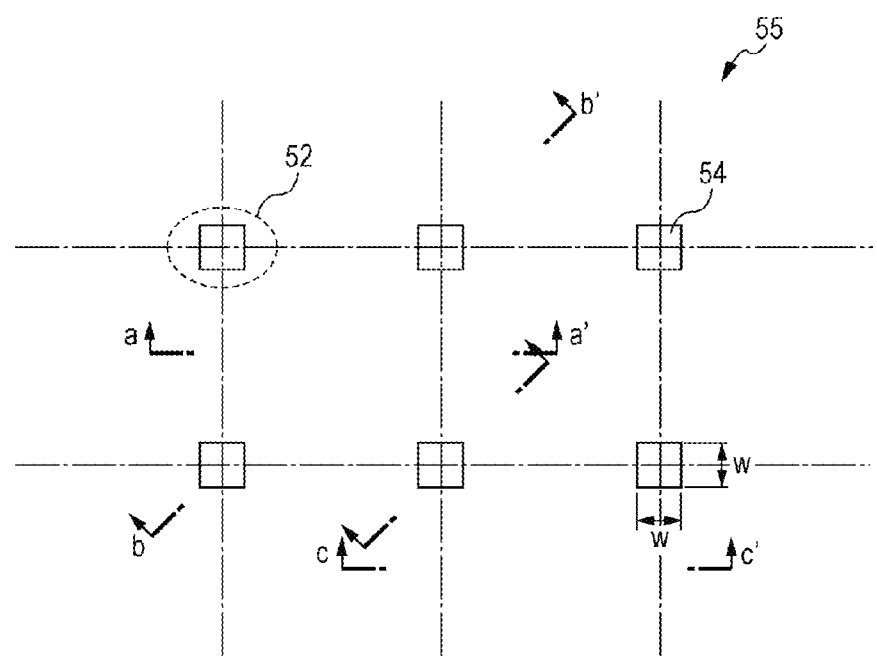
FIG. 20 is a diagram illustrating a photoresist of the color filter according to the second embodiment of the present disclosure.

As shown in FIG. 19B, the red filter component 2R is formed on the substrate 11. A photopolymerization negative type photoresist (red photoresist) in which a plurality of pigments are added so as to have a spectral characteristic of the red filter component 2R is applied onto the substrate 11. Next, the red photoresist is patterned in order for the red filter component 2R to be arranged as shown in FIG. 18 using a photolithography method. Each pattern edge of the red photoresist is formed on the end faces of the first light shielding portion 17 and the second light shielding portion 18 at the side of the microlens 16. That is, the red photoresist partially comes into contact with the end face of the first light shielding portion 17 and the second light shielding portion 18 at the side of the microlens 16. In addition, a sequence of forming the red filter component 2R and the blue filter component 2B may be exchanged from each other. That is, the blue filter component 2B may be formed after forming the red filter component 2R.

Figure 19C:
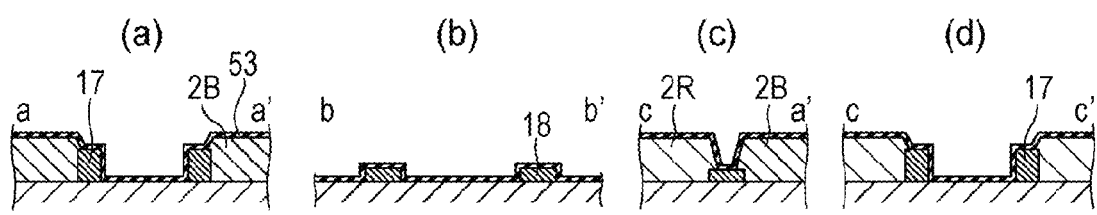

As shown in FIG. 19C, an inorganic film 53 is formed after forming the blue filter component 2B and the red filter component 2R. As the inorganic film 53, for example, a silicon oxide film, a silicon oxynitride film, or the like may used. In addition, although not shown, in a case where the silicon oxynitride film is used as the inorganic film 53, the inorganic film 53 may be adjusted to have the same refraction index as the microlens 16 by adjusting film forming conditions. Due to this, interface reflection in the inorganic film 53 decreases, and therefore the condensing property of the solid-state imaging device 100 may be improved.

Figure 19D:
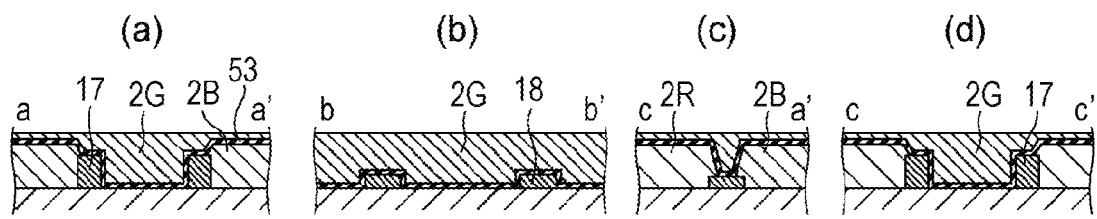

As shown in FIG. 19D, the green filter component 2G is formed on the inorganic film 53. Here, the green filter component 2G is formed by patterning the green photoresist using a photolithography method.

Figure 19E:
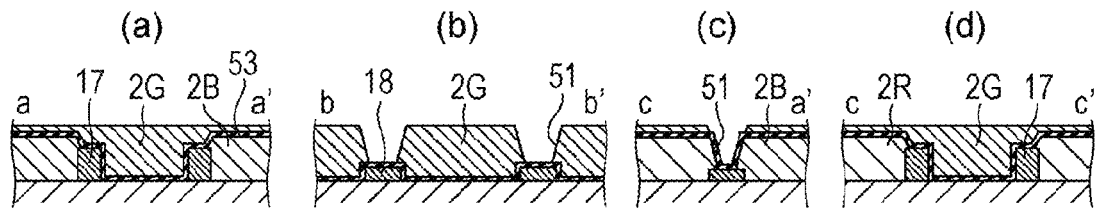

Next, as shown in FIG. 19E, the hole 51 is formed in the green filter component 2G. The hole 51 is formed by using a mask 55 having a light shielding portion 54 with a width w in four corners 52 shown in FIG. 20, which are corner portions of the pixel region. The hole 51 is formed by forming a pattern using the mask 55 through a lithography method. Since the green photoresist is a photopolymerization negative type photoresist, the hole 51 is formed at corner portions (four corner portion 52) of the pixel region by forming pattern using the mask 55. In addition, since a region other than the hole 51 is exposed to light at an opening region (region through which exposing light is transmitted) of the mask 55, the photopolymerization reaction sufficiently progress. Therefore, the green photoresist is cured, and therefore the green filter component 2G is formed on the inorganic film 53.

The size (diameter or depth) of the hole 51 formed in the green filter component 2G is determined by adjusting the width w of the light shielding portion 54 or an amount of exposure. FIG. 19E illustrates an example in which the hole 51 is formed to an upper portion of the second light shielding portion 18, but the hole 51 may be formed with the green filter component 2G left on the second light shielding portion 18 (not shown). In this case, the hole 51 in which a cross-section of the green filter component 2G shows a concave shape is formed.

Figure 19F:
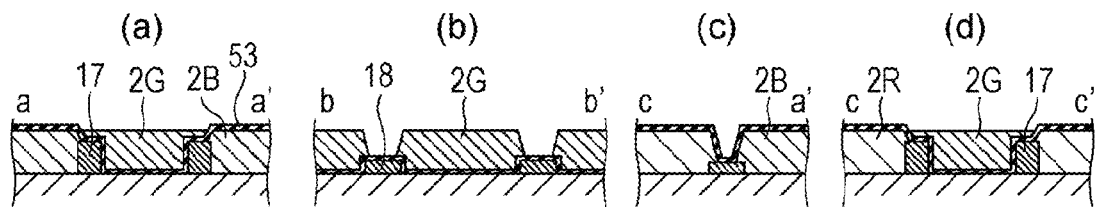

As shown in FIG. 19F, a planarization process is performed with respect to the green, blue, and red photoresists using a CMP (Chemical Mechanical Polishing) or a dry etching method. This planarization process is performed until the color filter 15 has the same film thickness as the first light shielding portion 17. in a case where each of the photoresists is planarized using the CMP, the end face of the first light shielding portion 17 at the side of the microlens 16 serves as a polishing stopper.

As described, the solid-state imaging device 100 according to this embodiment is able to obtain the same effect as the solid-state imaging device 1 according to the first embodiment, and the respective four corner portion 52 of the green filter components 2G come into contact with each other and thereby the green filter components 2G are integrally formed in succession. Therefore, the color filter 50 is hardly peeled off. Furthermore, the hole 51 is formed above the second light shielding portion 18, such that it is possible to make the solid-state imaging device 100 thin similarly to the example shown in FIG. 6. In addition, the inorganic film 53 covers the first and second light shielding portions 17 and 18, such that the reflection on the surfaces of first and second light shielding portions 17 and 18 decreases, and therefore a reduction in flare of the solid-state imaging device 100 may be realized.

In addition, the blue filter component 2B and the red filter component 2R may be formed with a self-alignment with respect to the green filter component 2G using a hard mask.

Third Embodiment

Next, a solid-state imaging device 200 according to a third embodiment will be described with reference to FIG. 21A to FIG. 23. The solid-state imaging device 200 according to this embodiment has the same configuration as the solid-state imaging device 1 according to the first embodiment except that a part of the light shielding film is buried in the substrate 11, and may be manufactured by the same manufacturing method as the first embodiment, such that like reference numerals will be given to like parts having substantially same functions, and redundant description thereof will be omitted.

Figure 21A:
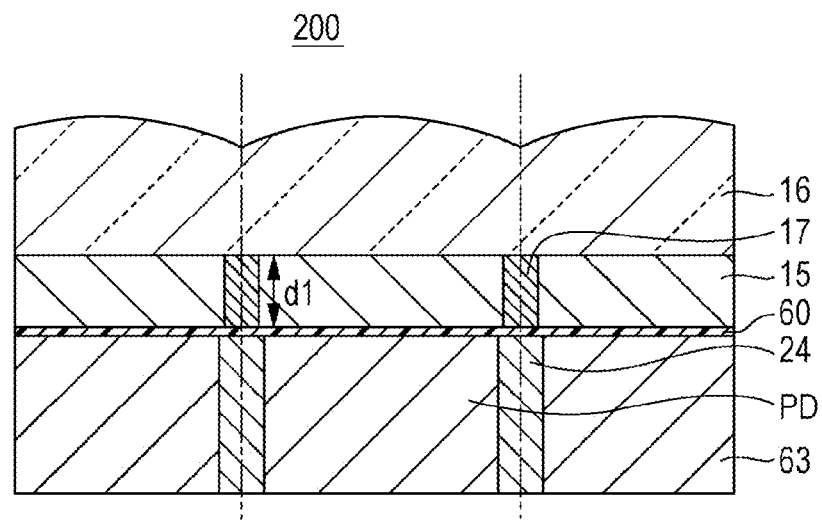
FIGS. 21A and 21B are cross-sectional views of a solid-state imaging device according to a third embodiment of the present disclosure.
Figure 21B:
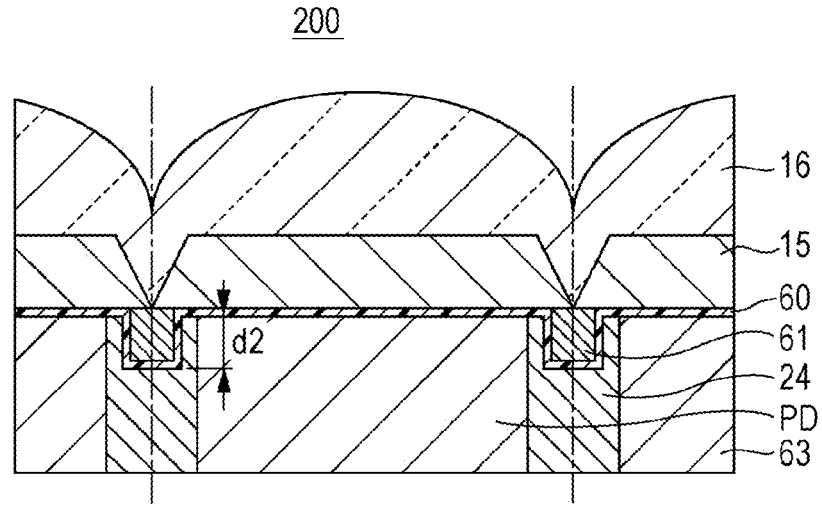

FIG. 21A show a cross-sectional view of the solid-state imaging device 200 according to the third embodiment in the side direction, and FIG. 21B shows a cross-sectional view thereof in the diagonal direction.

As shown in FIGS. 21A and 21B, the solid-state imaging device 200 includes a substrate 63 which is provided between the pixel 2 and the color filter 15 and in which a trench portion 62 is formed, and a film 60 that is formed on a rear surface of the substrate 63.

The substrate 63 has the trench portion 62 that is formed at the rear surface side of the substrate 63 to have a desired depth. This trench portion 62 is formed at each corner portion of the pixel region of the substrate 63 to have a cross shape similar to the second light shielding portion 18.

A second light shielding portion 61 is formed inside the trench portion 62. An end face (a first end face) of the second light shielding portion 61 at the side of the microlens is configured to be flush with the substrate 63. A thickness d2 of the second light shielding portion 61 may be the same as, or larger or smaller than the thickness d1 of the first light shielding portion 17. A material of the second light shielding portion 61 is the same as that of the first light shielding portion 17.

Since the end face of the second light shielding portion 61 at the side of the microlens is configured to be flush with the substrate 63, the distance from the pixel 2 to the end face of the second light shielding portion 61 at the side of the microlens becomes the same as the thickness of the substrate 63. On the other hand, the first light shielding portion 17 is formed on the substrate 63, such that the distance from the pixel 2 to an end face of the first light shielding portion 17 at the side of the microlens becomes the sum of the thickness of the substrate 63 and the thickness of the first light shielding portion 17. Therefore, in the first light shielding portion 17, the distance from the pixel 2 to the face (first end face) closest to the microlens 16 is longer in relation to the second light shielding portion 18.

In addition, although not shown here, a barrier metal may be provided between the second light shielding portion 61 and the film 60 similarly to the first embodiment.

As a material of the film 60, for example, a silicon oxide film (SiO), a silicon oxycarbide film (SiOC), an acryl-based resin, or the like may be exemplified, and the film 60 may be formed by a plasma CVD method or an application method.

Next, a method of manufacturing the solid-state imaging device 200 according to this embodiment will be described with reference to FIGS. 22A to 22F. (a) of FIGS. 22A to 22F shows a cross-sectional view of the solid-state imaging device 200 in the side direction, and (b) of FIGS. 22A to 22F shows a cross-sectional view of the solid-state imaging device 200 in the diagonal direction.

Figure 22A:
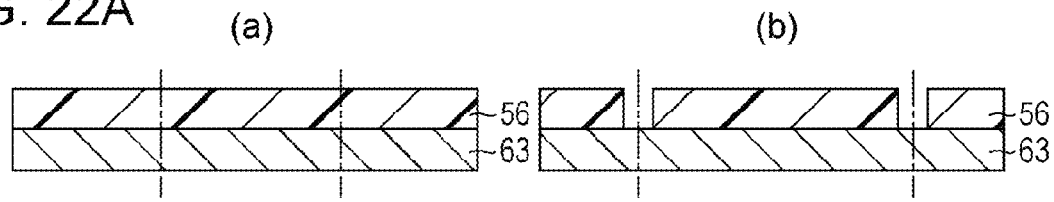
FIGS. 22A to 22F are manufacturing process diagrams of a light shielding film according to the third embodiment of the present disclosure.

As shown in FIG. 22A, a photoresist 56 is formed on the rear surface of the substrate 63 above the pixel 2, and exposing and development processes are performed to form an opening portion at a region in which the second light shielding portion 61 of the isolation region 24 is formed.

Figure 22B:
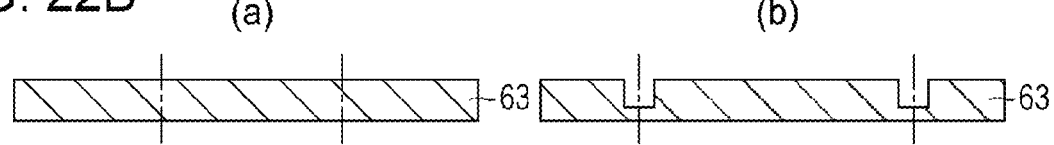

As shown in FIG. 22B, a dry etching is performed using the photoresist patterned to a desired shape as a mask, and therefore the trench portion 62 ranging from the rear surface of the substrate 63 to a desired depth is formed. A depth d2 of the trench portion 62 may be a depth to a degree that is capable of shielding the oblique incident light that is incident from the rear surface side of the substrate 63 at the light sensing surface side. In this embodiment, the trench portion 62 having the depth of, for example, 500 to 1000 nm from the rear side of the substrate 63 is formed.

Figure 22C:
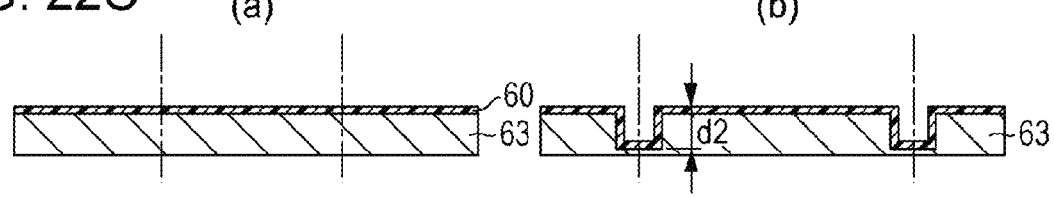
Figure 22D:
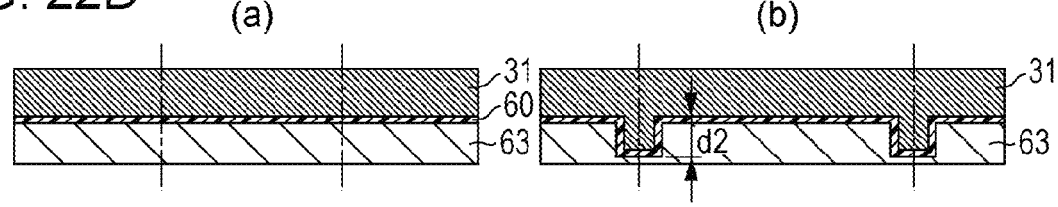

Next, a film 60 is formed on the rear surface of the substrate 63, for example, using a plasma CVD method or an application method (refer to FIG. 22C). After forming the film 60, a light shielding film 31 is formed on the film 60 (refer to FIG. 22D).

Figure 22E:
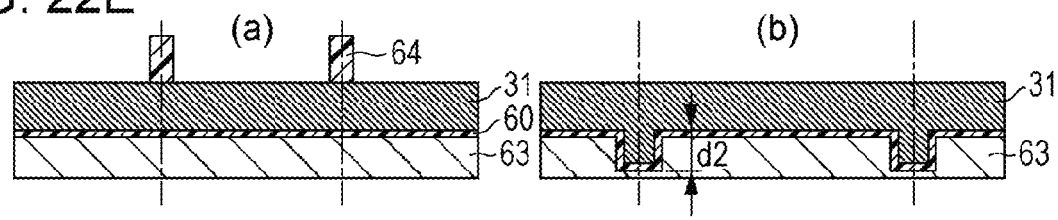
Figure 23:
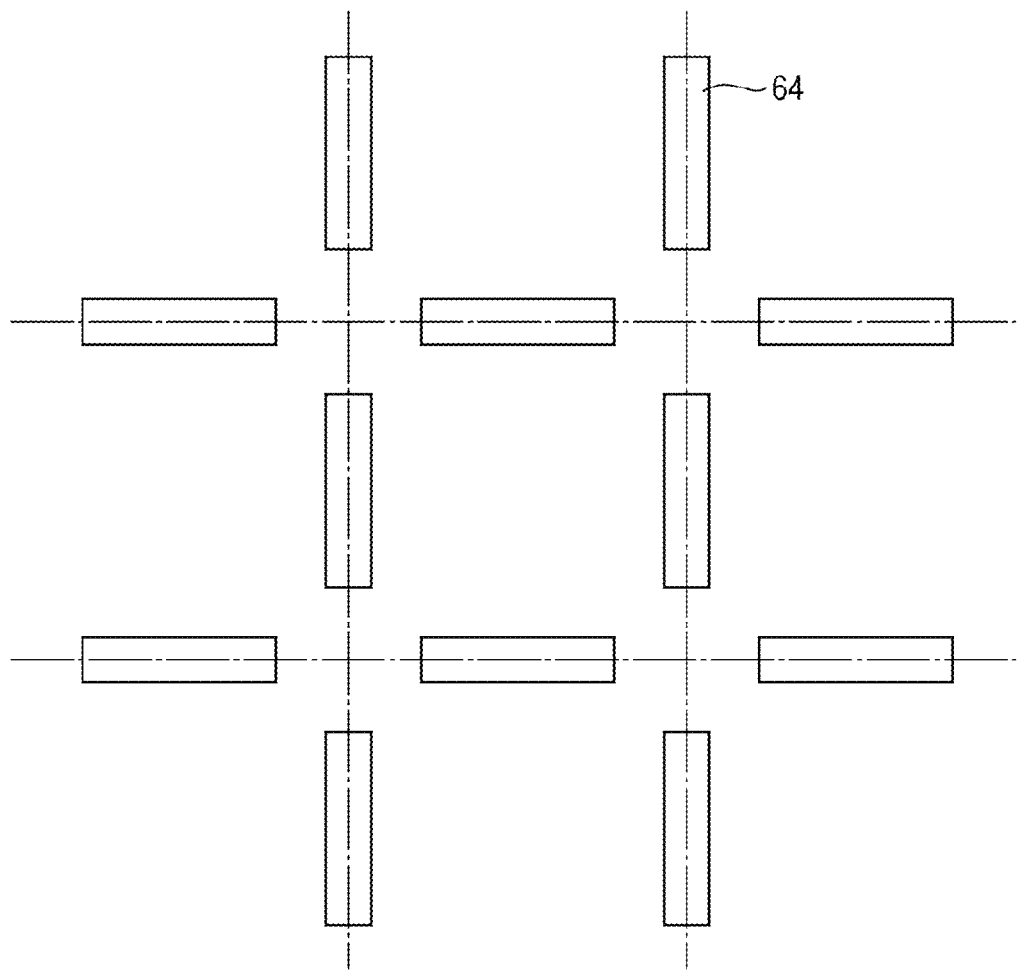
FIG. 23 is a diagram illustrating a photoresist of the light shielding film according to the third embodiment of the present disclosure.

A photoresist 64 shown in FIG. 23 is formed on the light shielding film 31 (refer to FIG. 22E). Broken lines in FIG. 23 represent boundaries of the pixel region. As shown in FIG. 23, the photoresist 64 has a quadrilateral shape similarly to the first light shielding portion 17, and is formed at each side portion of the pixel region.

The light shielding film that is an underlying layer is dry-etched using the photoresist 64 as a mask. Here, the light shielding film is dry-etched to the same depth as the thickness d1 of the first light shielding portion 17 so that the surface of the substrate 63 at an inner side of the pixel region is exposed.

Figure 22F:
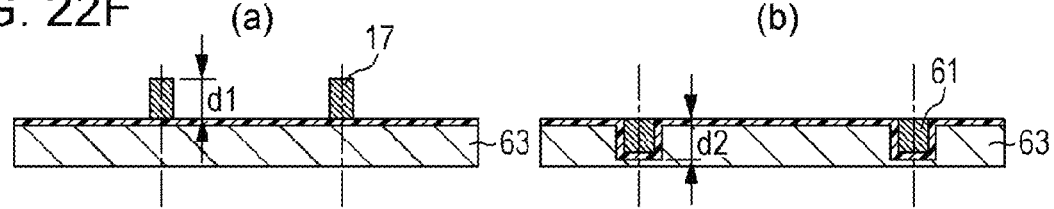

As shown in FIG. 22F, the photoresist is removed after the dry etching, and thereby the first light shielding portion 17 and the second light shielding portion 61 are formed.

As described above, the solid-state imaging device 200 according to this embodiment may obtain the same effect as the first embodiment, and the second light shielding portion 61 is buried in the substrate 63, such that the thickness of the second light shielding portion 61 may be larger than that of the second light shielding portion 18 of the solid-state imaging device 1 shown in FIGS. 2A and 2B. Therefore, it is possible to improve the effect of reducing the color mixture in which the incident light is leaked to the adjacent photoelectric conversion element PD.

Figure 24A:
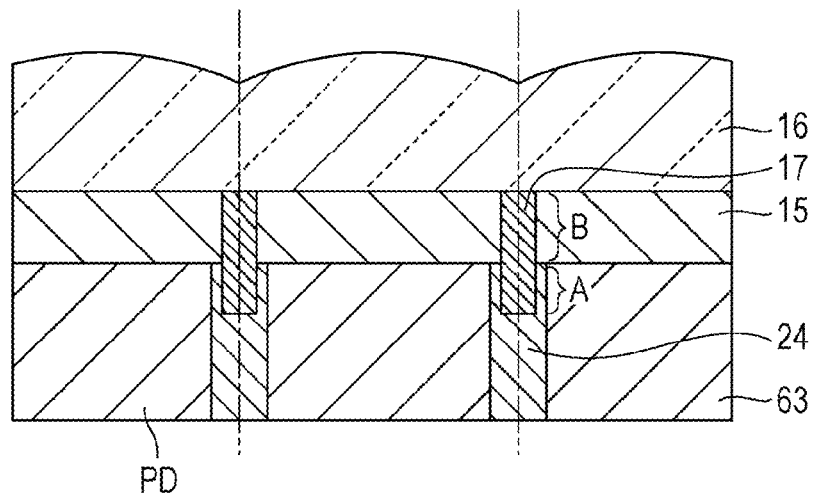
FIGS. 24A and 24B are cross-sectional views of the solid-state imaging device according to the third embodiment of the present disclosure.
Figure 24B:
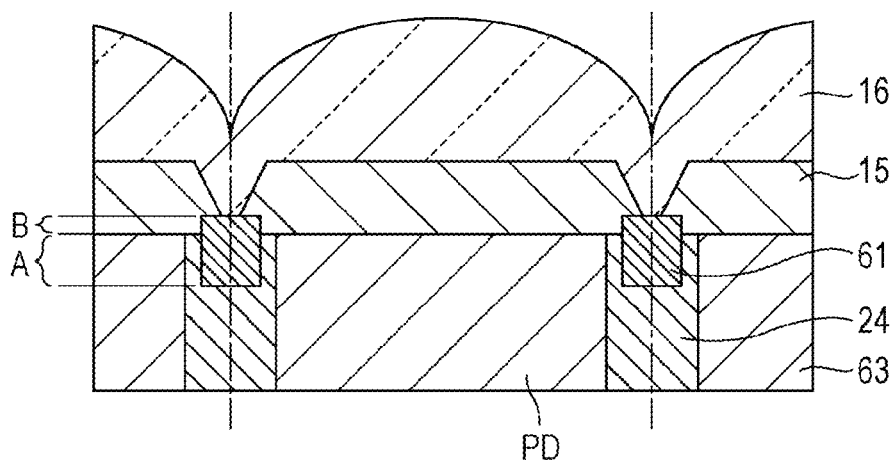

In addition, the second light shielding portion 61 related to this embodiment is formed in such a manner that the microlens side end face is flush with the rear surface of the substrate 63, but as shown in FIG. 24B, the end face may be configured to protrude from the rear surface. In addition, as shown in FIG. 24A, a part of the first light shielding portion 17 may be formed to be buried in the substrate 63. In addition, the light shielding film may be buried in the isolation region 24 of the pixel 2 instead of providing the substrate 63 on the pixel 2 and forming the light shielding film.

In this case, the portion (A in FIGS. 24A and 24B) of each of the first light shielding portion 17 and the second light shielding portion 61, which is provided inside the trench portion 62, and the portion (B in FIGS. 24A and 24B) thereof, which is not provided inside the trench portion 62 may contain the black color pigment different in each case. For example, the portion A provided in the trench portion 62 may be formed by a conductive material, and the portion B provided at the outside of the trench portion 62 may be formed by an organic material in which a coloring agent of a black color is dispersed.

In a case where the light shielding film is buried in the isolation region 24 of the pixel 2, the distance from the pixel 2 to each face (first end face) of the first and second light shielding portions 17 and 61, which is closest to the microlens 16, becomes the thickness of the portion B of FIGS. 24A and 24B, and the distance in the first light shielding portion 17 is longer compared to the second light shielding portion 61.

In this embodiment, the trench portion 62 is provided at the isolation region 24 of the substrate 63, but for example, in a case where a silicon layer is provided between the surface of the pixel 2 and the color filter 15, the trench portion may be provided in the silicon layer. The silicon region in which the trench portion 62 is formed is collectively referred to as a silicon layer. The trench portion 62 is formed to have a desired depth from the side of the face of the silicon layer, which comes into contact with the color filter 15.

In this embodiment, an example in which the second light shielding portion 18 of the solid-state imaging device 1 shown in FIGS. 2A and 2B is buried in the substrate 11 is described, but the second light shielding portion 18 of the solid-state imaging device 100 shown in FIGS. 14A and 14B may be buried in the substrate 11.

Fourth Embodiment

Subsequently, a solid-state imaging device 300 according to a fourth embodiment of the present disclosure will be described with reference to FIGS. 25 to 26D. The solid-state imaging device 300 is a device in which a pupil correction is performed with respect to the solid-state imaging device 1 according to the first embodiment. The others are the same as the solid-state imaging device 1, such that like reference numerals will be given to like parts having substantially same functions, and redundant description thereof will be omitted.

The vertically incident light is largely incident to the central pixel of the substrate 11 of the solid-state imaging device 300, and the obliquely incident light is largely incident to the peripheral pixels. As shown in FIG. 5D, when the pixel 2, the color filter 15, and the microlens 16 are arranged in a straight line, the light sensitivity with respect to the obliquely incident light decreases.

Therefore, in the solid-state imaging device 300 according to this embodiment, as shown in FIG. 25, a pitch P1 to arrange the color filter 15 is made to be smaller than a pitch P2 to arrange the microlens 16. FIG. 25 shows a plan view of the solid-state imaging device 300 seen from the microlens side. Although not shown, a pitch to arrange the pixel 2 is equal to that in the color filter 15.

Figure 26A:
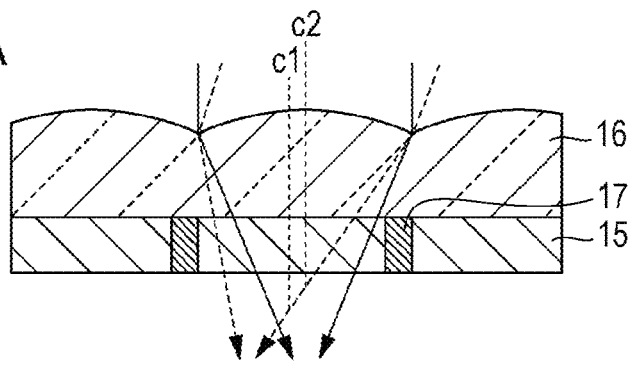
FIGS. 26A to 26D are cross-sectional views of the solid-state imaging device according to the fourth embodiment of the present disclosure.
Figure 26B:
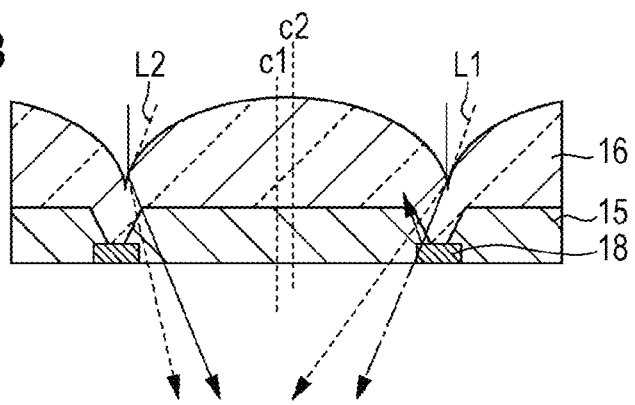

FIGS. 26A and 26B show cross-sectional views of the peripheral pixel (XXVI in FIG. 25) of the substrate 11. FIG. 26A shows a cross-sectional view of the peripheral pixel in the side direction, and FIG. 26B shows a cross-sectional view of the peripheral pixel in the diagonal direction. In addition, a cross-sectional view of the center pixel is the same as FIGS. 5A and 5B, such that the description thereof will be omitted.

Figure 26C:
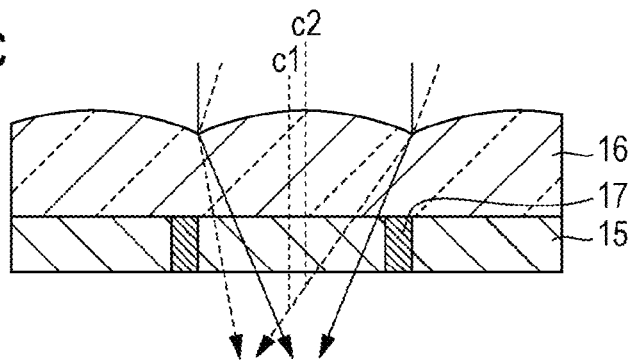
Figure 26D:
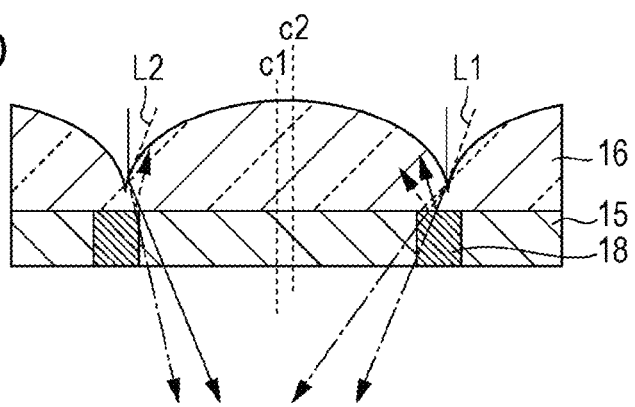

FIGS. 26C and 26D illustrate a solid-state imaging device in a case where the film thickness d2 of the second light shielding portion 18 shown in FIGS. 26A and 26B is made to be equal to the film thickness d1 of the first light shielding portion 17. That is, the pupil correction is performed with respect to the solid-state imaging device shown in FIGS. 5C and 5D.

As shown in FIGS. 26A and 26B, a center c2 of the microlens 16 is disposed to be deviated with respect to the center c1 of the color filter 15 toward the central direction of the substrate 11.

As shown in FIG. 26D, in a case where the film thickness d2 of the second light shielding portion 18 is made to be equal to the film thickness d1 of the first light shielding portion 17, even when the pupil correction is performed, all of obliquely incident light L1 and obliquely incident light L2 are shaded. In this manner, when the film thickness of the second light shielding portion 18 is made to be equal to that of the color filter 15, it is difficult to obtain the pupil correction effect.

On the other hand, as shown in FIG. 26B, when the film thickness d2 of the second light shielding portion 18 is made to be smaller than the film thickness d1 of the first light shielding portion 17, all of the obliquely incident light L1 and the obliquely incident light L2 are incident to the color filter 15. In addition, the obliquely incident light L2 that is shaded at the pixel center (refer to FIG. 5B) is incident to the color filter 15 at the peripheral pixel without being shaded.

As described above, the solid-state imaging device 300 according to this embodiment may obtain the same effect as the first embodiment, and the shading in the pixel provided at the peripheral portions of the substrate is further reduced by performing the pupil correction, such that particularly, the light sensitivity of the solid-state imaging device 300 at the peripheral pixel may be improved.

In this embodiment, since the pupil correction is performed, the centers of the microlens 16 and the color filter 15 are deviated from each other, these may be deviated due to a manufacturing variance. Furthermore, the line width or the formation position of the first light shielding portion 17 and the second light shielding portion 18 may be deviated due to a manufacturing variance of an apparatus of manufacturing semiconductor such as a dry etching apparatus or an exposing apparatus. When the line width or the formation position of the first light shielding portion 17 and the second light shielding portion 18 is deviated, a relative positional relationship of the light shielding film and the microlens 16 varies, and therefore a quantity of generation of noise may varies or the light sensitivity may be deteriorated.

However, as shown in this embodiment, the film thickness d2 of the second light shielding portion 18 is made to be smaller than that of the first light shielding portion 17, such that as shown in FIG. 26B, the incident light that is shaded by the second light shielding portion 18 decreases, and therefore characteristics of the solid-state imaging device 300 may be improved.

In addition, in this embodiment, a case in which the pupil correction is performed with respect to the solid-state imaging device 1 according to the first embodiment is described, but even when the same pupil correction is performed with respect to the solid-state imaging devices according to the first and second modifications, and the second and third embodiment, the same effect may be obtained.

Fifth Embodiment

Figure 27:
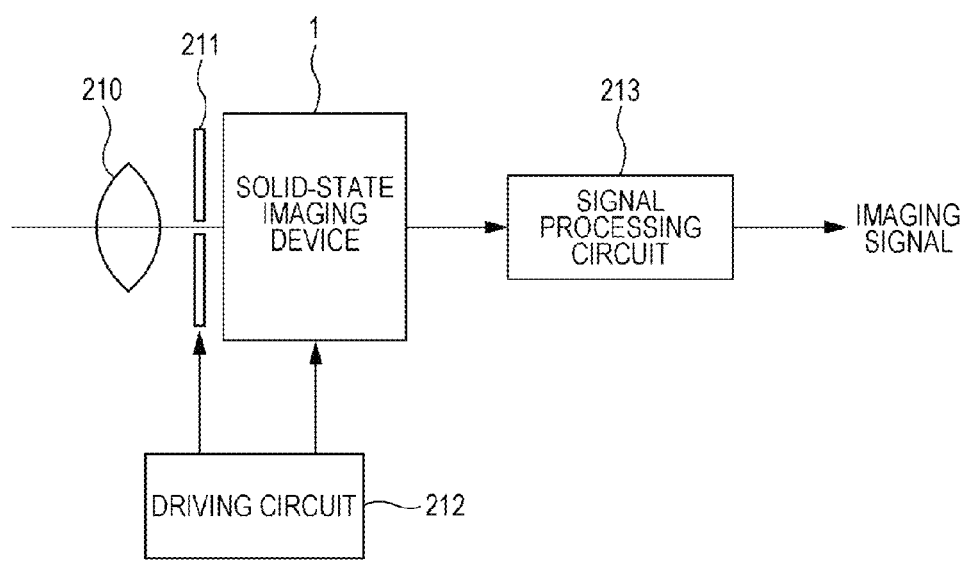
FIG. 27 is a diagram illustrating an electronic apparatus according to a fifth embodiment of the present disclosure.

Next, in a fifth embodiment of the present disclosure, an application example of the solid-state imaging device 1 will be described with reference to FIG. 27. FIG. 27 shows an example in which the solid-state imaging device 1 is applied to an electronic apparatus 400. As the electronic apparatus 400, for example, a digital camera, a camera of cellular phone or the like, a scanner, a monitoring camera, or the like may be exemplified, but a case in which the electronic apparatus 400 is the digital camera will be described here.

The electronic apparatus 400 according to this embodiment includes the solid-state imaging device 1, an optical lens 210, a shutter device 211, a driving circuit 212, and a signal processing circuit 213.

The optical lens 210 condenses image light (incident light) from a subject to an imaging plane of the solid-state imaging device 1. Therefore, a signal charge is stored in the solid-state imaging device 1 for a predetermined period.

The shutter device 211 controls a light irradiation period and a light shielding period with respect to the solid-state imaging device 1. The driving circuit 212 supplies a driving signal to control a transmission operation of the solid-state imaging device 1 and a shutter operation of the shutter device 211.

The solid-state imaging device 1 outputs the signal charge stored in the photoelectric conversion element PD on the basis of the driving signal.

The signal processing circuit 213 performs various kinds of signal processing. The signal processing circuit 213 performs the signal processing with respect to an electric signal output from the solid-state imaging device 1 to generate a video signal, and outputs the video signal to a storage medium such as a memory (not shown), a monitor, or the like (not shown).

As described above, in the electronic apparatus 400 according to this embodiment, the solid-state imaging device 1 according to the first embodiment is mounted, such that the light sensitivity may be improved, and therefore the quality of the video signal may be improved.

Here, an example in which the solid-state imaging device 1 according to the first embodiment is mounted in the electronic apparatus 400 is described, but the solid-state imaging devices according to the first and second modifications, and the second to fourth embodiments may be mounted in the electronic apparatus 400.

In addition, in the above-described respective embodiments, the rear surface irradiation type solid-state imaging device of the CMOS type is described as an example of the solid-state imaging device, but it is needless to say that the present disclosure is applicable to a CCD-type solid-state imaging device or the front surface irradiation-type solid-state imaging device.

Finally, the description of the respective embodiments is an example of the present disclosure, and the present disclosure is not limited to the above-described embodiments. Even when it is deviated from the above-described respective embodiments, various modifications may be made by a design or the like without departing from the scope of the present disclosure.

The present disclosure contains subject matter related to that disclosed in Japanese Priority Patent Application JP 2011-055630 filed in the Japan Patent Office on Mar. 14, 2011, the entire contents of which are hereby incorporated by reference.

What is claimed is:

1. A solid-state imaging device, comprising:
a plurality of pixel regions arranged on a substrate in horizontal rows and vertical columns, each pixel region including:
a pixel having a photoelectric conversion unit that converts incident light to an electric signal;
a color filter that is formed in correspondence with the pixel; and
a microlens that condenses the incident light to the photoelectric conversion unit through the color filter;
a first light shielding portion that has a first end face at the side of the microlens, and a second end face opposite to the first end face, and that is formed at each side portion of each pixel region of the plurality of the pixel regions, wherein the first light shedding portion is provided between vertically or horizontally adjacent color filters corresponding to vertically or horizontally adjacent pixel regions; and
a second light shielding portion that has a first end face at the side of the microlens, and a second end face opposite to the first end face, and that is formed at each corner portion of the pixel region, wherein the second light shielding portion is provided between diagonally adjacent color filters corresponding to diagonally adjacent pixel regions, and wherein a distance from a surface of the pixel to the first end face of the second light shielding portion is less than a distance from the surface of the pixel to the first end face the first light shielding portion.

2. The solid-state imaging device according to claim 1, wherein a thickness of the first light shielding portion is larger than that of the second light shielding portion, and the first and second light shielding portions, and the color filter are formed in the same plane as each other.

3. The solid-state imaging device according to claim 1, further comprising:
a silicon layer having a trench portion that is formed in a desired depth from a surface side that comes into contact with the color filter,
wherein at least a part of the second light shielding portion is provided inside the trench portion.

4. The solid-state imaging device according to claim 3, wherein at least a part of each of the first light shielding portion is provided inside the trench portion, and a thickness of a portion of the first light shielding portion, which is not provided inside the trench portion, is larger than a thickness of a portion of the second light shielding portion, which is not provided inside the trench portion.

5. The solid-state imaging device according to claim 4, wherein the portion of at least one of the first and second light shielding portions, which is provided inside the trench portion, and the portion of at least one of the first and second light shielding portions, which is not provided inside the trench portion are formed of materials different from each other.

6. The solid-state imaging device according to claim 2, wherein the first light shielding portion has a protrusion portion and a light shielding layer formed on a surface of the protrusion portion, and
the second light shielding portion has the same thickness as the light shielding layer.

7. The solid-state imaging device according to claim 2, wherein a thickness of the color filter is larger than that of the first light shielding portion.

8. The solid-state imaging device according to claim 1, wherein the color filter includes first to third color filter components, and
the second and third color filter components are surrounded by the first color filter component, and the first color filter component has a hole formed at a corner portion thereof.

9. The solid-state imaging device according to claim 1, wherein in the microlens, a thickness of the side portion of the pixel region is larger than that of the corner portion of the pixel region.

10. The solid-state imaging device according to claim 1, wherein the pixel portion, the color filter, and the microlens are formed on a substrate,
a center of the microlens that is provided at a peripheral portion of the substrate is disposed to be deviated in a central direction of the substrate with respect to a center of the corresponding color filter and pixel.

11. A method of manufacturing a solid-state imaging device, comprising:
forming pixels having a photoelectric conversion unit that converts incident light to an electric signal;
forming a color filter formed in correspondence with each of the pixels;
forming a microlens that condenses the incident light to the photoelectric conversion unit through the color filter; and
forming a first light shielding portion at each side portion of pixel regions including the pixel, the color filter, and the microlens, and has a first end face at the side of the microlens, and a second end face opposite to the first end face, wherein the first light shielding portion is formed between vertically or horizontally adjacent color filters corresponding to vertically or horizontally adjacent pixels, and forming a second light shielding portion at each corner of the pixel region, and that has a first end face at the side of the microlens and a second end face opposite to the first end face, wherein the second light shielding portion is formed between diagonally adjacent color filters corresponding to diagonally adjacent pixel regions, and wherein a distance from a surface of the pixel to the first end face of the second light shielding portion is less than a distance from the surface of the pixel to the first end face of the first light shielding portion.

12. The method according to claim 11, wherein the forming of first light shielding portion and second light shielding portion includes,
forming a light shielding film on a color filter-side face of the pixel or a layer that is disposed between the pixel and the color filter,
forming an opening portion having a depth shallower than a thickness of the light shielding film at each corner portion of the pixel region in the light shielding film, and
forming a resist having a width wider than that of the first light shielding portion on the light shielding film at each side portion of the pixel region, forming a resist having a width narrower than that of the opening portion on the light shielding film at each corner portion of the pixel region, and etching the light shielding film using the resist as a mask to form the first light shielding portion and the second light shielding portion.

13. The method according to claim 11, wherein the forming of first light shielding portion and second light shielding portion includes,
forming a light shielding film on a color filter-side face of the pixel or a silicon layer that is disposed between the pixel and the color filter,
forming an opening portion, which has a depth equal to a thickness of the light shielding film, in the light shielding film at an inner side of each pixel boundary, and
forming a resist at an inner side and each side portion of the pixel region, and etching the light shielding film using the resist as a mask by a thickness smaller than the thickness of the light shielding film to form the first light shielding portion and second light shielding portion.

14. The method according to claim 11, wherein the forming of first light shielding portion and second light shielding portion includes,
forming a light shielding film on a color filter-side face of the pixel or a silicon layer that is disposed between the pixel and the color filter,
forming, on the light shielding film, a resist having a first transmittance at each side portion of the pixel region, a resist having a second transmittance at each corner portion of the pixel region, and a resist having a third transmittance an inner side of the pixel region, and etching the light shielding film using the resists as a mask to form the first light shielding portion and the second light shielding portion.

15. The method according to claim 11, wherein the forming of first light shielding portion and second light shielding portion includes,
forming a protrusion portion on a color filter-side face of the pixel or a silicon layer that is disposed between the pixel and the color filter, at each side portion of the pixel region,
forming the light shielding film on the pixel or silicon layer, and the protrusion portion, and
removing the light shielding film at an inner side of the pixel region.

16. The method according to claim 11, wherein the forming of first light shielding portion and second light shielding portion includes,
forming a trench portion in a color filter-side face of the pixel or a silicon layer that is disposed between the pixel and the color filter, forming a light shielding film on a color filter-side face of the pixel or silicon layer, and on a surface of the trench portion, and
etching the light shielding film using a resist formed at each corner portion of the pixel region and an inner side thereof as a mask to form the first light shielding portion and the second light shielding portion.

17. The method according to claim 11,
wherein the forming of a color filter includes forming the color filter in such a manner that a thickness of the color filter is larger than that of the first light shielding portion.

18. The method according to claim 11,
wherein the forming of a color filter is performed to form the color filter so as to surround a periphery of each of a first color filter component, a second color filter component, and a third color filter component, and
wherein the forming of the color filter includes,
forming any one of the first color filter component, the second color filter component, and the third color filter component in opening portions of a mask formed on the pixel or a silicon layer disposed between the color filter and the pixel,
forming remainders of the color filter components in opening portions formed by removing the mask, and
forming holes at the corner portion of the pixel region in the first color filter component.

19. An electronic apparatus, comprising:
a solid-state imaging device including a plurality of pixel regions arranged on a substrate in horizontal rows and vertical columns each including:
  a pixel having a photoelectric conversion unit that converts incident light to an electric signal;
  a color filter that is formed in correspondence with the pixel; and
  a microlens that condenses the incident light to the photoelectric conversion unit through the color filter;
a first light shielding portion that has a first end face at the side of the microlens, and a second end face opposite to the first end face, and that is formed at each side portion of each pixel region of the plurality of the pixel regions, wherein the first light shielding portion is provided between vertically or horizontally adjacent color filters corresponding to vertically or horizontally adjacent pixel regions; and
a second light shielding portion that has a first end face at the side of the microlens, and a second end face opposite to the first end face, and that is formed at each corner portion of the pixel region, wherein the second light shield portion is provided between diagonally adjacent color filters corresponding to diagonally adjacent pixel regions, and wherein a distance from a surface of the pixel to the first end face of the second light shielding portion is less than a distance form the surface of the pixel to the first end face of the first light shielding portion;
an optical lens that guides incident light to a photoelectric conversion unit; and
a signal processing circuit that processes an electric signal.

20. The solid-state imaging device according to claim 1, further comprising:
an isolation region at each side portion of each pixel region, wherein each isolation region is in contact with a side surface of a photoelectric conversion unit, and wherein at least one of the first light shielding portion and the second light shielding portion is formed on each isolation region.

* * * * *